United States Patent [19]

Watanabe

[11] 4,427,302
[45] Jan. 24, 1984

[54] TIMEKEEPING SIGNAL SOURCE FOR AN ELECTRONIC TIMEPIECE

[75] Inventor: Shinichi Watanabe, Tanashi, Japan

[73] Assignee: Citizen Watch Company Limited, Tokyo, Japan

[21] Appl. No.: 269,296

[22] Filed: Jun. 1, 1981

[30] Foreign Application Priority Data

Jun. 6, 1980 [JP] Japan ................................. 55-076210
Oct. 13, 1980 [JP] Japan ................................. 55-141959

[51] Int. Cl.³ ............................................... G04G 3/02
[52] U.S. Cl. .................................... 368/200; 368/202; 368/159; 331/47
[58] Field of Search ............... 368/155, 156, 159, 200, 368/201, 202, 85, 86, 217, 218, 219; 331/46, 47

[56] References Cited

U.S. PATENT DOCUMENTS 4,241,435 12/1980 Fujita et al. ......................... 368/200
4,264,967 4/1981 Fujita et al. ......................... 368/200

Primary Examiner—F. W. Isen
Attorney, Agent, or Firm—Jordan and Hamburg

[57] ABSTRACT

A timekeeping signal source for an electronic timepiece produces a highly accurate timekeeping signal which is stable in frequency with respect to both temperature variations and long-term drift. The timekeeping signal is produced by phase lock control using a high frequency reference signal from a crystal-controlled high-frequency oscillator. Phase lock control can be performed continuously or on an intermittent basis, in order to reduce power consumption. In addition, the timekeeping rate can be adjusted with a resolution within one period of the high frequency reference signal, by variation of a numeric value stored in digital memory means.

11 Claims, 15 Drawing Figures

TIMEKEEPING SIGNAL SOURCE FOR AN ELECTRONIC TIMEPIECE

BACKGROUND OF THE INVENTION

The present invention relates to a timekeeping signal source for an electronic timepiece.

Electronic timepieces utilizing quartz crystal controlled oscillator circuits as a standard frequency signal source are now in widespread use. Such timepieces can be broadly divided into two basic types, i.e. wristwatches and clocks. A significant difference between these two types lies in the fact that the power consumption of an electronic wristwatch must be made as small as possible, in order to enable the battery lifetime to be maximized. This is necessary due to the extremely small size of battery used in such a timepiece, which has a correspondingly low power supply capacity. In the case of an electronic clock, the power consumption limitations are much less stringent. It is for this reason that the quartz crystal oscillator circuit of an electronic clock generally operates at a relatively high frequency, of the order of 4,194,304 Hz, while in the case of an electronic wristwatch, the quartz crystal oscillator generally operates at a much lower frequency, e.g. 32,768 Hz. The reason for this difference in frequencies is that the power consumption of the frequency divider circuit of the timepiece, which produces a timekeeping signal of, say one second period, from the crystal oscillator circuit output signal, increases significantly as the oscillator circuit frequency is increased. In addition, the power consumption of a quartz crystal oscillator circuit operating at a frequency of the order of 30,000 Hz is appreciably lower than that of an oscillator circuit operating in the region of 4 megaherz. However, use of a high crystal oscillator frequency has the advantage of providing a much higher degree of frequency stability, with respect to ambient operating temperature variations and long-term frequency drift, as compared with a lower oscillation frequency such as is utilized in electronic wristwatches.

Another problems which arises with regard to using a relatively low frequency quartz crystal oscillator circuit in an electronic timepiece lies in the area of frequency adjustment. It is necessary to adjust the timekeeping rate of an electronic timepiece extremely precisely, to provide accurate timekeeping, this adjustment being generally carried out at the time of manufacture. The generally utilized method of adjustment hitherto, for electronic wristwatches, has been to couple a variable capacitor to the quartz crystal oscillator circuit of the timepiece, and adjust this capacitor to vary the frequency of oscillation very slightly, in order to adjust the timekeeping rate of the timepiece. Such a method has the serious disadvantage that the capacitance value of such a variable capacitor will vary, over the long term, thereby resulting in drift of the timekeeping rate from the initially adjusted value. A preferable method of timekeeping rate adjustment is to perform digital adjustment, for example by varying the division ratio of the frequency divider circuit of the timepiece. However, with the low frequency of oscillation of the oscillator circuit generally used in an electronic wristwatch, such a digital adjustment method provides only a coarse degree of adjustment resolution, so that the timekeeping rate cannot be precisely set to a desired value. For this reason, digital adjustment of the timekeeping rate of an electronic wristwatch has not been utilized hitherto, on a practical basis, in spite of the advantages of such a method.

A timekeeping signal source according to the present invention for an electronic timepiece, and in particular for an electronic wristwatch, provides the advantages described above which are attained by utilizing a high frequency quartz crystal oscillator circuit, namely, a high degree of frequency stability against ambient operating temperature variations together with a low level of long-term frequency drift, and also enables the timekeeping rate to be precisely adjusted in a digital manner, with the adjustment resolution being within to one period of a high frequency reference signal produced by a quartz crystal high frequency oscillator circuit. At the same time, since the timekeeping signals are produced by frequency division of a relatively low frequency signal, which is obtained by controlling the frequency of oscillation of a relatively low frequency quartz crystal oscillator circuit, in accordance with the high frequency reference signal, the advantage of low power consumption is also provided by a timekeeping signal source according to the present invention. Thus, a timekeeping signal source according to the present invention enables an electronic timepiece to be produced having a highly accurate and stable timekeeping rate, yet also having a low level of power consumption and hence a long battery lifetime.

SUMMARY OF THE INVENTION

The present invention basically comprises a timekeeping signal source for an electronic timepiece, consisting of a high frequency quartz crystal oscillator circuit which produces a high frequency reference signal, a low frequency quartz crystal oscillator circuit whose frequency of oscillation can be switched between at least a higher frequency of oscillation and a lower frequency of oscillation, phase comparison circuit means for comparing the phase of the high frequency reference signal with that of the output from the low frequency quartz crystal oscillator, or a signal produced by frequency division of the output signal from the low frequency quartz crystal oscillator circuit, and circuit means for switching the frequency oscillation of the low frequency quartz crystal oscillator circuit to the lower frequency of oscillation when it is detected that the phase of the output signal from the low frequency quartz crystal oscillator circuit has advanced with respect to the output signal frequency of the high frequency quartz crystal oscillator circuit and for switching the frequency of oscillation of the low frequency quartz crystal oscillator circuit to the higher frequency of oscillation when it is detected that the phase of the output signal from the low frequency quartz crystal oscillator circuit has become delayed with respect to the output signal frequency from the high frequency quartz crystal oscillator circuit. In addition, a timekeeping signal source according to the present invention also comprises digital memory means for storing a numeric value, and circuit means for periodically advancing or delaying the phase of the output signal from the low frequency quartz crystal oscillator circuit (or a signal produced by frequency division thereof) by one or more periods of the high frequency reference signal, with the number of periods of phase advance or delay being equal to the numeric value stored in the digital memory means, and with the phase of the output signal from the low frequency quartz crystal oscillator circuit being periodically either advanced or delayed in accordance with the sign of the numeric value stored in the digital memory means.

In other words, the frequency of oscillation of the low frequency quartz crystal oscillator circuit can be locked in phase with the high frequency reference signal, and the frequency of the timekeeping signal produced (and hence the timekeeping rate of the timepiece) can be adjusted by periodically advancing or delaying the phase of the output signal from the low frequency quartz crystal oscillator circuit, by an amount which can be as small as one period of the high frequency reference signal, or an integral multiple of that period. Thus, by varying the contents of the digital memory means, the timekeeping rate can be finely and precisely adjusted. In addition, since the frequency stability of the timekeeping signal produced is determined essentially by the frequency stability of the high frequency reference signal from the high frequency quartz crystal oscillator circuit, a much higher degree of stability of the timekeeping rate with respect to temperature variations and long-term drift can be obtained than is possible with a relatively low frequency quartz crystal oscillator circuit used digital memory means. The result of such periodic phase advance or retardation is to adjust the timekeeping rate by a small amount, in an advancing or retarding direction, with the amount of rate adjustment being proportional to the numeric value stored in the digital memory means. Thus, by altering the latter numeric value, the timekeeping rate can be finely adjusted, i.e. trimmed, without the necessity for using a trimmer capacitor. The present invention therefore enables the problems associated with use of a trimmer capacitor for timekeeping rate adjustment to be eliminated, thereby enabling an electronic timepiece to be produced which has superior timekeeping rate stability, in addition to improved accuracy.

In addition, it is possible with the present invention to operate the high frequency oscillator circuit in an intermittent manner, i.e. to set the high frequency oscillator circuit in operation during periodic short intervals. In this way, the power consumption of the high frequency oscillator circuit can be substantially reduced. To ensure that inaccuracy will not be caused by variations in the frequency of oscillation of the high frequency oscillator circuit during the initial start-up interval after oscillation is initiated, the high frequency output signal is not utilized until after a predetermined time interval has elapsed after start-up of operation of the high frequency oscillator circuit. During each interval in which the high frequency oscillator circuit is in operation, data is generated specifying how the frequency of oscillation of the low frequency oscillator circuit should be controlled in order to achieve an accurate timekeeping rate. This information is stored in a memory circuit (e.g. a counter circuit) and is utilized to control the operation of the low frequency oscillator circuit during the intervals in which the high frequency oscillator circuit is not in operation. In this way, a highly accurate timekeeping rate can be attained, even with the high frequency oscillator circuit being operated in an intermittent manner.

DESCRIPTION OF THE PREFERRED EMBODIMENTS

Figure 1:
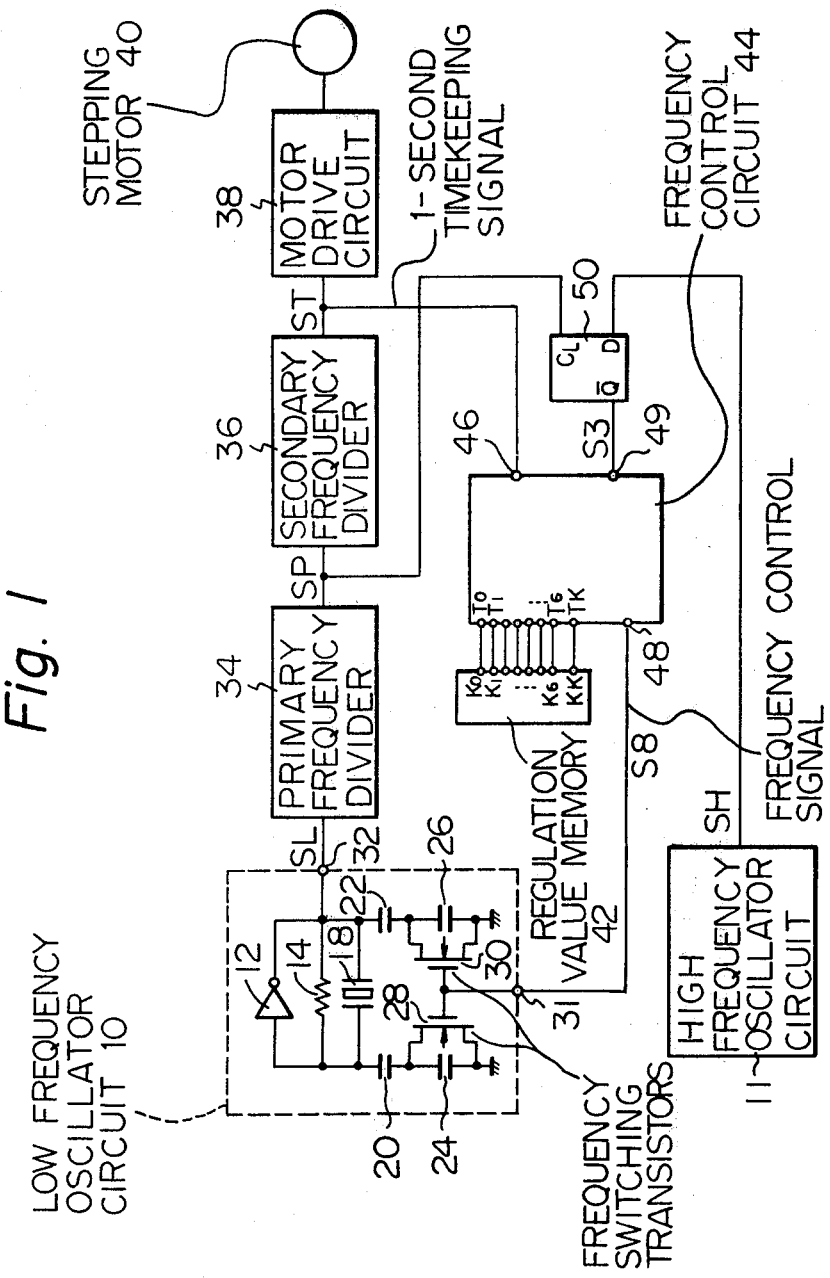
FIG. 1 is a block circuit diagram of an electronic timepiece which includes a first embodiment of a timekeeping signal source according to the present invention.

Referring now to the drawings, FIG. 1 is a block circuit diagram illustrating the general configuration of an electronic timepiece which incorporates a first embodiment of a timekeeping signal source according to the present invention. Numeral 10 denotes a low frequency oscillator circuit, comprising a CMOS inverter 12, feedback resistor 14, quartz crystal vibrator 18, input capacitor 20, and output capacitor 22. The latter components are connected to form a quartz crystal controlled oscillator circuit of well-known type. In addition, several components are provided which constitute means for changing over the frequency of oscillation of low frequency oscillator circuit 10, between two different frequencies. These components comprise a capacitor 24 which is connected in series between input capacitor 20 and ground potential, a capacitor 26 which is connected between output capacitor 22 and ground potential, a frequency switching transistor 28, having drain and source terminals connected across the terminals of capacitor 24, and a frequency switching transistor 30 having drain and source terminals connected across the terminals of output capacitor 26. The gate electrodes of transistors 28 and 30 are connected in common to an input terminal 31, to be controlled by a signal applied thereto, to be described hereinafter. When transistors 28 and 30 are in the ON state, a short-circuit condition is established across capacitors 24 and 26, i.e. capacitors 24 and 26 have no effect upon the oscillator circuit operation. In this case, low frequency oscillator circuit 10 operates at a frequency of oscillation which shall be designated as fL1, i.e. an output signal SL produced by low frequency oscillator circuit 10 has a frequency fL1. When transistors 28 and 30 are set into the OFF state, then capacitors 24 and 26 effectively reduce the value of input capacitor 20 and output capacitor 22 respectively, so that the frequency of oscillation of low frequency oscillator circuit 10 has a value that shall be designated as fL2, which is higher than the oscillation frequency fL1.

Numeral 11 denotes a high frequency oscillator circuit which is also of quartz crystal-controlled type, of wellknown design. The high frequency oscillator circuit 11 produces a high frequency output signal SH at a frequency of approximately 4,194,304 Hz.

It is a basic feature of the present invention that the frequency of oscillation of SL from low frequency oscillator circuit 10 is brought into phase lock with respect to the output signal SH from high frequency oscillator circuit 11, with this phase lock condition being established either on a continuous or a periodic basis. With the first embodiment of the present invention shown in FIG. 1, this phase lock condition is maintained continuously, by means to be described hereinafter. Thus, the average frequency of output signal SL from low frequency oscillator circuit 10 is held close to a fixed value, with the degree of fluctuation from this fixed value due to temperature changes, etc, being determined essentially by the degree of such fluctuations occurring in the frequency of the output signal SH from high frequency oscillator circuit 11.

If it is assumed that the frequency of oscillation of low frequency oscillator circuit 10 can be switched in a plurality of discrete steps between the values $L_1, L_2, \ldots L_n$, and the frequency of output signal SL from low frequency oscillator circuit 10 is designated as $fL_i$, then the relationship between fH and $fL_i$ if given by the following equations:

$$fH = fL_i \times m \quad (1)$$

where m is a positive integer $$fL_i\text{max.} > fH/m \quad (2)$$

$$fL_i\text{min.} < fH/m \quad (3)$$

where "max" indicates the maximum value of the frequency of oscillation of low frequency oscillator circuit and "min" indicates the minimum frequency of oscillation thereof.

In the present embodiments, m=128, n=2. Thus, since $$fL_i\text{max.} = fL2 \text{ and } fL_i\text{min.} = fL1$$

the relationships exist:

$$fL_i = fH/128 = 4194304/128 = 32,768 \text{ Hz}$$
$$fL2 > 32768 > fL1$$

Referring again to FIG. 1, output signal SL from low frequency oscillator circuit 10 is supplied to a primary frequency divider circuit 34, which produces a primary frequency division signal SP by frequency division of signal SL. Primary frequency divider circuit 34 comprises three frequency divider stages, so that output signal SP has a frequency of approximately 4096 Hz. Signal SP is input to a secondary frequency divider circuit 36, which performs frequency division thereof to produce a timekeeping signal ST, which has a period of one second. Timekeeping signal ST is input to a motor drive circuit 38, which produces signals to drive a stepping motor 40. Stepping motor 40 drives the hands of a time display, through a gear train (not shown in the drawings).

Numeral 44 denotes a frequency control circuit, having input terminals 46, 48 and 49. Numeral 50 denotes a data-type flip-flop (abbreviated hereinafter to DFF) which functions as a phase comparison circuit, for comparing the phase of signal SP with that of signal SH from high frequency oscillator circuit 11, i.e. which uses signal SH as a reference signal for phase comparison. Signal SP is applied to the clock input terminal of DFF 50, and signal SH is applied to the data input terminal D. An output signal S3, referred to herein as the phase signal, is produced from the $\overline{Q}$ output terminal of DFF 50, and is applied to input terminal 49 of frequency control circuit 44. An output signal S8, referred to herein as the frequency control signal, is produced by frequency control circuit 44 from terminal 48, and is applied through a terminal 31 of low frequency oscillator circuit 10 to control the switching transistors 28 and 30, in order to control the frequency of signal SL in accordance with the phase signal S3 as described hereinafter.

Numeral 42 denotes a regulation value memory, which comprises digital memory means for storing a numeric value designating an amount by which the timekeeping rate of the timepiece is to be adjusted, either in an advancing or a retarding direction. The actual form of regulation value memory 42 can be for example a random access memory (RAM), whereby the memory contents can be set by the user, by actuating some data input means such as a crown-operated switch or a pushbutton switch which is coupled to regulation value memory 42. Another possible configuration for regulation value memory 42 is that of a read-only memory (ROM), into which data is set at some time prior to use of the timepiece, e.g. at the time of manufacture. Such a RAM or ROM function can be built into the timepiece integrated circuit. Alternatively, regulation value memory 42 can consist simply of a number of connections made to a set of terminals, so that the terminals are variously connected to high and low logic level potentials, whereby output signals from these terminals represent the memory contents. However, whichever configuration is adopted, regulation value memory 42 comprises digital memory means in which a numeric value having either a positive or negative sign is stored, with the sign of the numeric value serving to designate adjustment of the timekeeping rate in either an advancing or retarding direction, i.e. designating that the frequency of timekeeping signal ST is to be increased or decreased. In the present embodiment, the contents of regulation value memory 42 appear on a set of output terminals designated as K0 to K6 and KK. The absolute value of the numeric value stored in regulation value memory 42 is represented in binary form by the signals appearing on terminals K0 to K6, while the sign of the memory contents is represented by the signal appearing on output terminal KK. It should be noted that, although in the present embodiment, the sign of the numeric value held in regulation value memory 42 is expressed by a sign bit, it is equally possible to express the memory contents as a complement. The output signals from terminals K0 to K6 of regulation value memory 42 will be referred to herein as the regulation value bits, while the output signal on terminal KK will be referred to as the regulation sign bit.

If the timekeeping error rate of the timepiece is designated as S, then S is generally expressed by the following equation:

$$S = Ti/Ta - 1 \qquad (4)$$

where Ta is a unit of actually elapsed time, and Ti amount of elapsed time indicated by the timepiece during unit time Ta. If unit time Ta is defined as the time during which a number R of pulses of high frequency signal SH at a frequency fH occur, and if the value for Ta of R/fH is substituted in equation (4), then the following equation is obtained:

$$S = (Ti \times fH)/R - 1 \qquad (5)$$

The time interval Ti will be referred to hereinafter as the timekeeping rate adjustment interval. If the condition that the timekeeping error rate S be zero is applied to equation (5), then the relation $R = Ti \times fH$ is true. Values of fH and R which, in combination, meet the latter relationship will be designated as the standard high frequency value fHo and Ro the standard number of high frequency pulses respectively. Thus:

$$Ro = Ti \times fHo \qquad (6)$$

If So designates the standard timekeeping error rate for which the quantity R in equation (5) has the value Ro, then:

$$So = (Ti \times fH)/Ro - 1 \times fH/fHo - 1 \qquad (7)$$

The numeric value stored in regulation value memory 42, designating either timekeeping rate advancement or retardation, will be referred to hereinafter as the regulation value K. Substituting the value (Ro−K) for R in equation (5), the following equation is obtained to express the timekeeping error rate S:

$$S = (Ti \times fH)/(Ro - K) - 1 \qquad (8)$$

The resolution of timekeeping rate adjustment will be designated as $\Delta$. Thus:

$$\Delta = 1/Ro \qquad (9)$$

If the timekeeping error rate S is assumed to be close to zero, then by using equation (7), equation (8) can be approximately converted to the following:

$$S = So + (K \times \Delta) \qquad (10)$$

Thus, even if the frequency of oscillation of high frequency oscillator circuit 11, i.e. frequency fH, is not equal to fHo, it is still possible to set the timekeeping error rate S close to zero, by varying the regulation value K (i.e. the numeric value stored in regulation value memory 42), so as to adjust the amount $(K \times \Delta)$. In this way, if So is positive, the quantity $(K \times \Delta)$ can be made negative and with an absolute value almost equal to So, for example. Thus, the actual timekeeping error rate S can be reduced almost to zero by suitably adjusting the regulation value K.

In the present embodiment, the timekeeping rate adjustment interval Ti is 8 seconds, as described hereinafter, while frequency fHo is 4,194,304 Hz. Thus, Ro is given as 33,554,432, from equation (4). A value for the timekeeping adjustment resolution $\Delta$ of 1/33,554,432 is thereby obtained, from equation (9), i.e. a value of approximately 0.03 parts per million (abbreviated hereinafter to ppm). If the regulation value K is in the form of an n-bit binary number, then $|K|$ max$=2^n-1$, where "max" signifies the maximum value. In the present embodiment, $n=7$. Thus, $|K|$ max$=127$. The values of regulation value K therefore lie in the range from $-127$ to $+127$. Because of this, and since the timekeeping adjustment resolution $\Delta$ is approximately 0.03 ppm, the range of adjustment of the timekeeping error rate S, given by equation (10), is approximately $\pm 3.8$ ppm.

Figure 2:
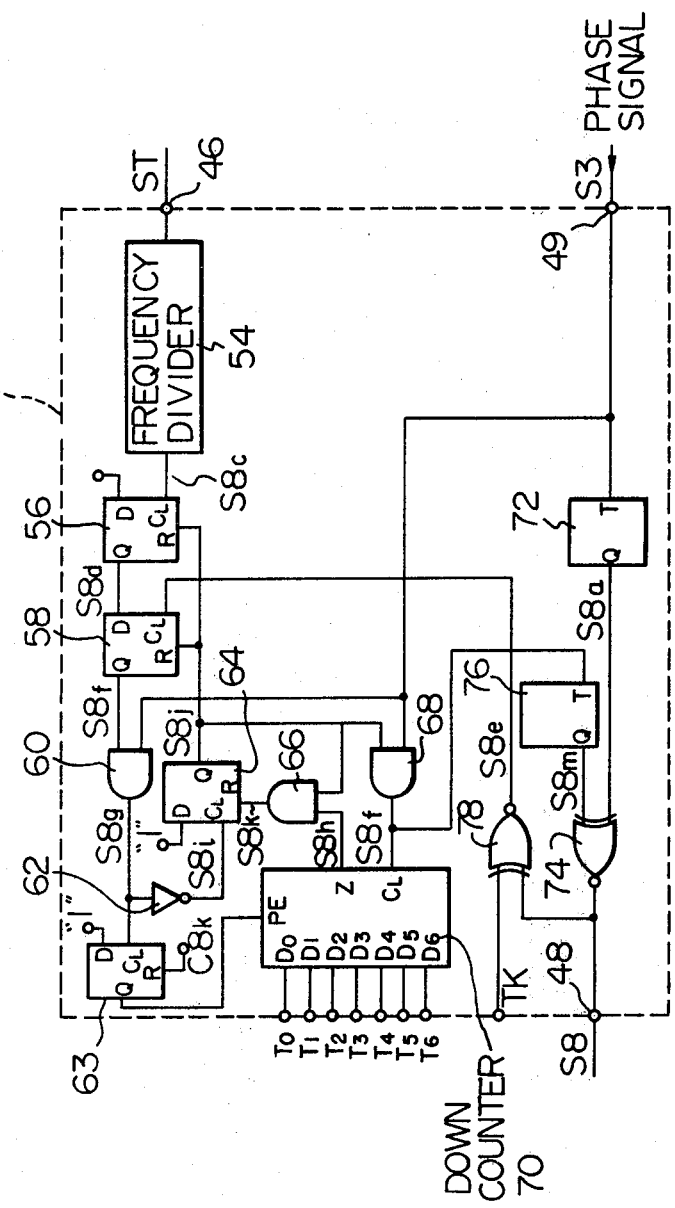
FIG. 2 is a circuit diagram of a frequency control circuit used in the embodiment of FIG. 1.

Referring now to FIG. 2, a block circuit diagram is shown therein of frequency control circuit 44. Numeral 72 denotes a toggle-type flip-flop (abbreviated hereinafter to TFF), which receives the phase signal S3 from input terminal 49, and produces an output signal S8a, referred to herein as the basic frequency control signal. Signal S8a is applied to one input of an exclusive-NOR (abbreviated hereinafter to XNOR) gate 74, which produces a signal S8, referred to herein as the frequency control signal. Timekeeping signal ST is applied from input terminal 46 to the input of a frequency divider circuit 54, comprising three frequency divider stages. In response, frequency divider circuit 54 produces a signal S8c, referred to herein as the regulation signal, which has a period of 8 seconds. The timekeeping rate adjustment interval Ti, referred to hereinabove, is equal to the period of regulation signal S8c. It should be noted that if the number of stages of frequency divider circuit 54 were to be reduced to only one, for example, then since the timekeeping rate adjustment interval Ti would be reduced to 2 seconds, the timekeeping adjustment resolution $\Delta$ would be approximately 0.12 ppm. Although this degree of resolution is not so fine as that attained by using an 8 second timekeeping rate adjustment interval, it has the advantage of being compatible with certain widely used types of timekeeping rate measurement instruments, which perform rate measurements over 2-second intervals. Numeral 56 denotes a DFF having the data input terminal D connected to the "1" logic level potential, and regulation signal S8c applied to the clock input terminal CL. An output signal S8d from DFF 56, referred to herein as the regulation processing start signal, is applied to the data input terminal of a DFF 58. The output signal S8f from the Q output of DFF 58 is applied to one input of an AND gate 60. Numeral 70 denotes a down counter circuit having a preset enable terminal PE which is coupled to receive a preset signal produced by a DFF 63. Down counter circuit 70 is also provided with a zero-detection terminal Z, clock input CL, and a set of data input terminals D0 to D6. Down counter circuit 70 is of a well-known type, in which terminal Z remains at the "1" logic level so long as the counter contents are zero, and goes to the "1" logic level on the negative-going edge of a pulse applied to the PE or CL input terminals subsequent to the contents becoming other than zero. The data input terminals D0 to D6 are connected via a corresponding set of input terminals T0 to T6 to receive the regulation value bit signals from terminals K0 to K6 of regulation value memory 42, as shown in FIG. 1. An AND gate 60 receives the signals S8f and S3, and produces a signal S8g, which is applied to the clock terminal of DFF 63. DFF 63 is connected such as to produce a single pulse, as a reset signal for down counter 70, on the rising edge of a pulse of signal S8g. Numeral 62 denotes an inverter which applies the inverse of signal S8g, i.e. signal S8i, to the clock input terminal CL of a DFF 64. The data input terminal D of DFF 64 is connected to the "1" logic level potential. An output signal S8j, referred to herein as the regulation processing signal is applied to reset terminal R of DFF 56 and DFF 58, and also to one input of an AND gate 68. Phase signal S3 is applied to the other input of AND gate 68, whose output signal S8r is applied to the clock input terminal CL of down counter 70, and also to the toggle input terminal T of a TFF 76. The output signal S8m from TFF 76, referred to herein as the mode signal, is applied to the other input of XNOR gate 74. The regulation processing signal S8j is also applied to one input of an AND gate 66, which receives the zero detection signal S8h from terminal Z of down counter 70 on another input, and produces an output signal S8k referred to hereinafter as the processing end signal. Signal S8k is applied to the reset input terminal R of DFF 64. The regulation sign bit signal from terminal KK of regulation value memory 42 is applied via an input terminal T6 to one input of an XNOR gate 78. Frequency control signal S8 is applied to the other input of XNOR gate 78, which produces as output a signal S8e, referred to herein as the regulation coincidence signal. Signal S8e is applied to the clock input terminal of DFF 58.

Figure 3:
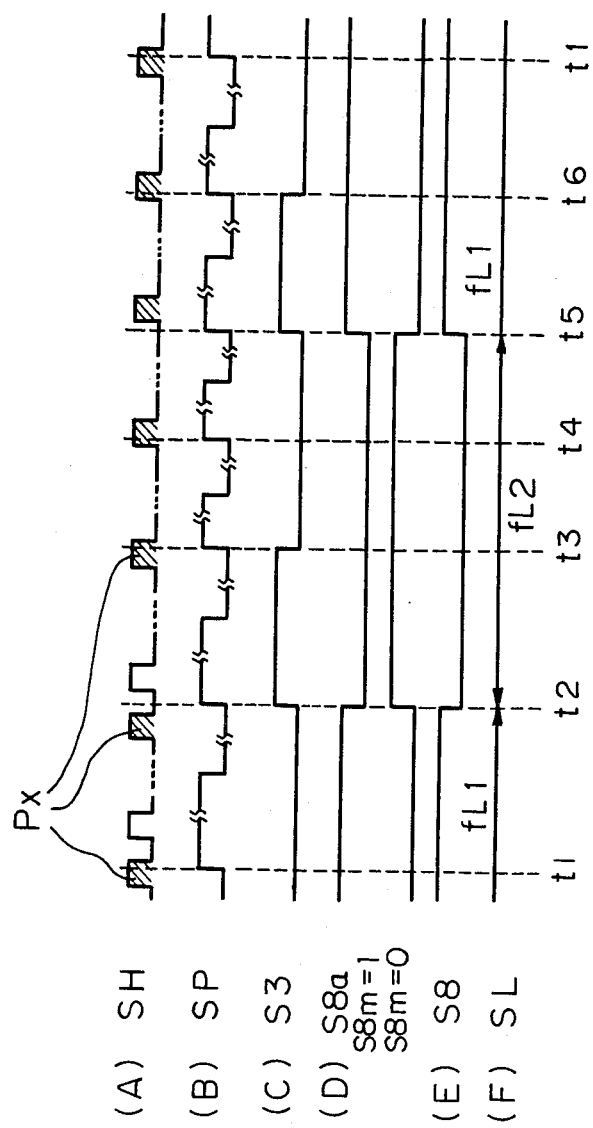
FIG. 3 is a timing diagram for illustrating the frequency control operation of the embodiment of FIG. 1.

The operation of the circuits of FIGS. 1 and 2 will now be described. Frequency control circuit 44, in conjunction with phase comparison circuit 50 performs two basically separate functions. One of these functions is to establish a highly stable frequency of timekeeping signal ST, by holding signal SP in phase lock with the high frequency reference signal SH. The other function is to periodically advance or delay the phase of signal SP by a discrete number of periods of high frequency reference signal SH, with the amount of phase advancement or retardation being determined by the numeric value which is held in regulation value memory 42, to thereby adjust the timekeeping rate S by an amount proportional to that stored numeric value (i.e. the regulation value K). The first of these functions will be described now with reference to the timing diagram of FIG. 3. The condition in which signal SP is being held inphase lock with signal SH will be referred to hereinafter simply as "phase lock operation". During phase lock operation, output signal S8r from AND gate 68, referred to hereinafter as the down clock signal, is held at the "0" logic level. Thus, mode signal S8m is held at either the "1" logic level or "0" logic level. As shown in FIG. 3, if mode signal S8m is at the "1" logic level, then frequency control signal S8 is the inverse of basic frequency control signal S8a from TFF 72, while if mode signal S8m is at the "0" logic level then frequency control signal S8 is identical to basic frequency control signal S8a. FIG. 3(A) illustrates the waveform of high frequency reference signal SH. A series of pulses denoted as Px, indicated by cross-hatching, occur once in every 1024 periods of signal SH. FIG. 3(B) shows the waveform of signal SP from primary frequency divider circuit 34. FIG. 3(C) shows phase signal S3. FIG. 3(D) shows the basic frequency control signal S8a, for the case in which mode signal S8m is at the "1" logic level, and further shows signal S8a for the case in which mode signal S8m is held at the "0" logic level. FIG. 3(E) shows the frequency control signal S8. FIG. 3(F) illustrates the way in which the output signal SL from low frequency oscillator circuit 10 is switched between lower frequency fL1 and higher frequency fL2 in accordance with frequency control S8.

Immediately prior to the first time point t1 shown in FIG. 3, the states of the various signals are as follows. Signals SP and S3 are at the "0" logic level. If mode signal S8m is at the "1" logic level, then basic frequency control signal S8a is also at the "1" logic level. If mode signal S8m is at the "0" logic level, then signal S8a is also at the "0" logic level. Frequency control signal S8 is at the "1" logic level, and as a result frequency switching transistors 28 and 30 of low frequency oscillator circuit 10 are in the ON state, so that signal SL is at the lower frequency fL1. At time t1, a rising edge of signal SP occurs, during a pulse Px of signal SH, so that output signal S3 from the Q output of DFF50 remains at the "0" logic level. Thus, signals S8a and S8 remain unchanged, so that signal SL remains at the lower frequency fL1. Frequency fL1 has been predetermined such as to be slightly less than an exact submultiple of frequency fH of high frequency reference signal SH, i.e. $fL1 < fH/m$, where m is a positive integer. Similarly, the higher frequency of signal SL, $fL2 > fH/m$. Thus, during and after time t1, when the frequency of signal SL is at the lower frequency fL1, the phase of signal SP will become delayed with respect to signal SH, since signal SP is produced by frequency division of signal SL. As a result, at a subsequent time point t2, the rising edge of signal SP occurs slightly after a pulse Px of signal SH, i.e. while signal SH is at the "0" logic level. Thus, output signal S3 from DFF 50 becomes inverted, going to the "1" logic level. As a result, basic frequency control signal S8a is also inverted on the rising edge of signal S3, so that frequency control signal S8 from XNOR gate 74 goes to the "0" logic level. Frequency switching transistors 28 and 30 are thereby changed to the OFF state, so that output signal SL from low frequency oscillator circuit 10 goes to the higher frequency fL2. Because of this increase in the frequency of signal SL, and hence of signal SP, the phase of signal SP advances with respect to signal SH, so that at a subsequent time point t3, a rising edge of signal SP once more occurs during a pulses Px of signal SH. Signal S3 thereby goes to the "0" logic level, but signals S8a and S8 remain unchanged. Signal SL therefore remains at the higher frequency fL2, so that the phase of signal SP continues to advance relative to signal SH. At a subsequent time point t4, a rising edge of signal SP occurs closer to the rising edge of a pulse Px of signal SH, i.e. further to the left, as seen in FIG. 3. At subsequent time point t5, the phase advance of signal SP results in the rising edge of a pulse of signal SP occurring prior to a Px pulse of signal SH, i.e. while signal SH is at the "0" logic level. As a result, signal S3 goes to the "1" logic level, thereby causing basic frequency control signal S8a to be inverted. The frequency control signal S8 is also inverted thereby, so that the frequency of signal SL again becomes the lower frequency fL1. Thereafter, the phase of signal SP again advances with respect to signal SH, so that at time t6 a rising edge of signal SP occurs during a Px pulse of signal SH. Thereafter, the rising edge of signal SP occurs at a timing identical to that at the initial time point t1, so that thereafter the cycle of operations described above, from t1 to t6, is repeated. In this way, the frequency of signal SL is repetitively switched between an upper frequency fL2 and a lower frequency fL1 in such a way as to maintain phase lock of signal SP (produced by frequency division of signal SL) with the high frequency reference signal SH. It will also be apparent from the above description that this phase lock relationship is maintained irrespective of whether the mode signal S8m is at the "1" or the "0" logic level.

Figure 4:
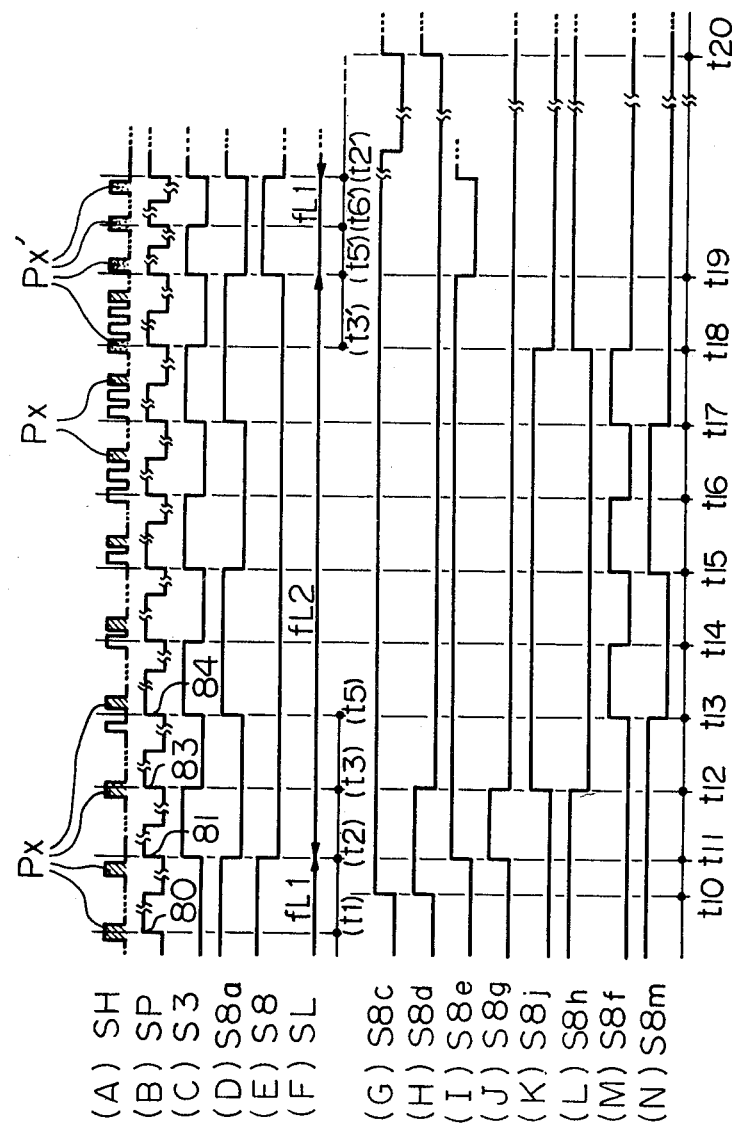
FIG. 4 is a timing diagram for illustrating the timekeeping rate adjustment operation of the embodiment of FIG. 1.

The frequency adjustment function of the circuits of FIGS. 1 and 2 will now be described, with reference to the timing diagram of FIG. 4. In the following description it will be assumed that a regulation value of +3 is stored in regulation value memory 42. With the regulation value K having a position sign, the regulation sign bit from terminal KK of regulation value memory 42 will be at the "0" logic level, the regulation value bit signals from terminals K0 to K1 will be at the "1" logic level, while the regulation value bit signals from terminals K2 to K6 will be at the "0" logic level. FIGS. 4(A) to 4(F) are similar to FIGS. 3(A) to 3(F), and hence will not be described in detail. FIG. 4(G) shows the waveform of regulation signal S8c, FIG. 4(H) shows the regulation start signal S8d, FIG. 4(I) shows the regulation coincidence detection signal S8e, FIG. 4(J) shows the preset signal S8g, FIG. 4(K) shows the regulation processing signal S8j, FIG. 4(L) shows the zero detection signal S8h, FIG. 4(M) shows the down clock signal S8r, and FIG. 4(N) shows the mode signal S8m. Immediately prior to time t10 in FIG. 4, the states of the various signals are as follows. Signals SH, SP, S3, S8a and S8 are in the conditions shown in FIG. 3, prior to time t1 of that diagram, with mode signal S8m being at the "1" logic level. Since the regulation sign bit signal applied from terminal TK to an input of XNOR gate 78 is at the "0" logic level, the regulation coincidence detection signal S8e must be the inverse of signal S8, i.e. at the "0" logic level. The regulation processing start signal S8d and preset signal S8g are at the "0" logic level, and zero detection signal S8h is at the "1" logic level. Down clock signal S8r is also at the "0" logic level. In this condition, phase lock operation is being performed, and will continue to be performed so long as regulation signal S8c remains at the "0" logic level. However, since signal S8c is produced by frequency division of the one-second timekeeping signal ST, this signal has a period of 8 seconds, and hence rises periodically to the "1" logic level as indicated at time t10 in FIG. 14. As a result, regulation start processing signal S8d goes to the "1" logic level, but all of the other signals remain unchanged. At time t11, signal S8 goes to the "0" logic level on the rising edge of signal S3, so that the preset signal S8g goes to the "1" logic level. Since the data terminal of DFF 58 is connected to the "1" logic level potential, signal S8f then rises to the "1" logic level, whereby AND gate 60 is enabled. Since phase signal S3 also goes to the "1" logic level at time t11, the preset signal S8g which is output from AND gate 60 goes to the "1" logic level. As a result, a single pulse is output by DFF 63, whereby the data being applied to terminals D0 to D6 of down counter circuit 70 are written into that counter circuit as an initial count value. On the negative-going edge of this pulse from DFF 63, since the contents of down counter 70 are now other than zero, output terminal Z goes to the "0" logic level, as explained hereinabove. At this time, AND gate 68 is still inhibited by regulation processing signal S8j at the "0" logic level, so that phase lock operation continues. At the subsequent time point t12, phase signal S3 falls to the "0" logic level so that preset signal S8g goes to the "0" logic level. Whereby a rising edge of signal S8i from inverter 62 occurs. As a result, since the data input terminal D of DFF 64 is at the "1" logic level, regulation processing signal S8j rises to the "1" logic level. DFF 56 and 58 are thereby reset, so that signals S8d and S8f go to the "0" logic level, so that AND gate 60 is now inhibited.

Preset signal S8g remains at the "0" logic level thereafter, until a subsequent time t20, when regulation signal S8c again rises to the "1" logic level.

AND gate 68 is now in the enabled state, and phase signal S3 is transferred therethrough to be applied as down clock signal S8r to the clock input CL of down counter circuit 70. Thereafter, successive rising edges of down clock signal S8r are counted by down counter 70. As shown in FIG. 4, by time t17, three successive rising edges of signal S8r have occurred, so that after time t17, the contents of down counter 70 are zero. Down counter 70 performs an automatic check for a count of zero upon each falling edge of the signals applied to clock terminal CL and present enable terminal PE. Thus, zero detection signal S8h rises to the "1" logic level at time t18, on the third downward transition of down clock signal S8r. As shown in FIG. 4(N), mode signal S8m, which is produced by TFF 76, is inverted on each transition of signal S8r from the "0" to the "1" logic level. Thus, at time t13, signal S8m goes from the "1" to the "0" logic level, whereby XNOR gate 74 causes frequency control signal S8 to become the inverse of basic frequency control signal S8a. The frequency control signal S8 is therefore held at the "0" logic level from time t11 to t15, and so signal SL from low frequency oscillator circuit 10 is held at the higher frequency fL2 during this time. As a result, the phase of signal SP becomes advanced with respect to signal SH, so that by time t14, the rising edge of signal SP falls within a pulse Px of signal SH. Subsquently at time t15, mode signal S8m is inverted, going to the "0" logic level and thereby causing frequency control signal S8 to become identical to the basic frequency control signal S8a, due to the action of XNOR gate 78. Thus, signal S8 remains at the "0" logic level. The phase of signal SP therefore continues to advance relative to signal SH, so that by time t16, a rising edge of signal SP has advanced in phase by two periods of signal SH, to coincide in time with an SH signal pulse at the "1" logic level. At a subsequent time t17, the same condition as described above for time t13 again occurs, so that signal S8 is held at the "0" logic level. Thus, by time t18, a rising edge of signal SP coincides with a pulse of signal SH which is advanced in phase by three periods of signal SH relative to a Px pulse, i.e. appears moved to the left by three pulses of signal SH in FIG. 4. Such a phase-advanced pulse of signal SH is indicated as Px' in FIG. 4(A). From the above, it can be understood that XNOR gate 74 functions as a form of modulator circuit means, which acts to modulate the basic frequency control signal in accordance with timekeeping rate setting information stored in regulation value memory 42, i.e. the regulation value. In other words, XNOR gate 74 serves to inhibit the transfer of pulses of basic frequency control signal S8a to become frequency control signal S8, for a number of pulses of phase signal S3 which is equal to the regulation value stored in memory 42. As a result, the frequency control S8 remains at a fixed logic level during a time determined by that number of pulses of signal S3, so that the output signal from low frequency oscillator circuit 10 is held either at the higher frequency fL2 (as in the present example) or at the lower frequency fL2, in accordance with the logic level of regulation sign bit signal KK, for that time duration. In this way, the frequency of signal SL is periodically increased or decreased during a certain time interval, to thereby adjust the timekeeping rate in accordance with the regulation value.

The timekeeping error rate S will now be derived for the example described above, i.e. for a regulation value K of +3. As stated above, the timekeeping rate adjustment interval Ti is 8 seconds for the present embodiment. Since high frequency reference signal SH has a frequency of approximately 4,194,304 Hz, the number of pulses of signal SH produced during the timekeeping rate adjustment interval Ti of 8 seconds is equal to $8 \times 4,194,304 = 33,554,432$. In other words, the quantity Ro, described hereinabove, is equal to 33,554,432. However, due to the frequency adjustment operation described above with reference to FIG. 2, for a regulation value K of +3, actually (Ro−3) pulses of signal SH are produced during the 8-second timekeeping rate adjustment interval. Using the values given above for Ro, K and assuming an actual frequency of 4,194,303,6 Hz for reference signal SH, the value of the timekeeping rate for a regulation value K of zero, i.e. So, can be derived from equation (7) as approximately, −0.095 ppm, i.e. a timekeeping retardation of approximately 0.095 ppm. The timekeeping adjustment resolution is thereby given from equation (9) as approximately 0.03 ppm. Thus, from equation (10), the actual timekeeping error rate S, provided by the regulation value +3, is given as approximately −0.005 ppm.

From the above, it can be understood that by setting an appropriate regulation value K into regulation value memory 42, a slight discrepancy between the actual frequency of oscillation of high frequency oscillator circuit 11 and a frequency which is an exact multiple of 1 Hz (i.e. in the present embodiment a frequency of $2^{15} \times 128 \text{ Hz} = 4,194,304 \text{ Hz}$) can be adjusted for, so that a highly accurate timekeeping signal ST is produced, i.e. the timekeeping error rate S can be made extremely small. In addition, since the frequency of the timekeeping signal ST is now determined essentially by that of the reference high frequency signal SH, deviations of the timekeeping rate due to temperature variations and long-term drift effects are considerably reduced, by comparison with utilization of a low frequency quartz crystal controlled oscillator circuit alone. However, since frequency division to derive the timekeeping signal ST is performed on the output from a low frequency oscillator circuit, the overall power consumption of the circuitry is not significantly increased, by comparison with a timepiece which incorporates only a low frequency quartz crystal oscillator circuit.

Figure 5:
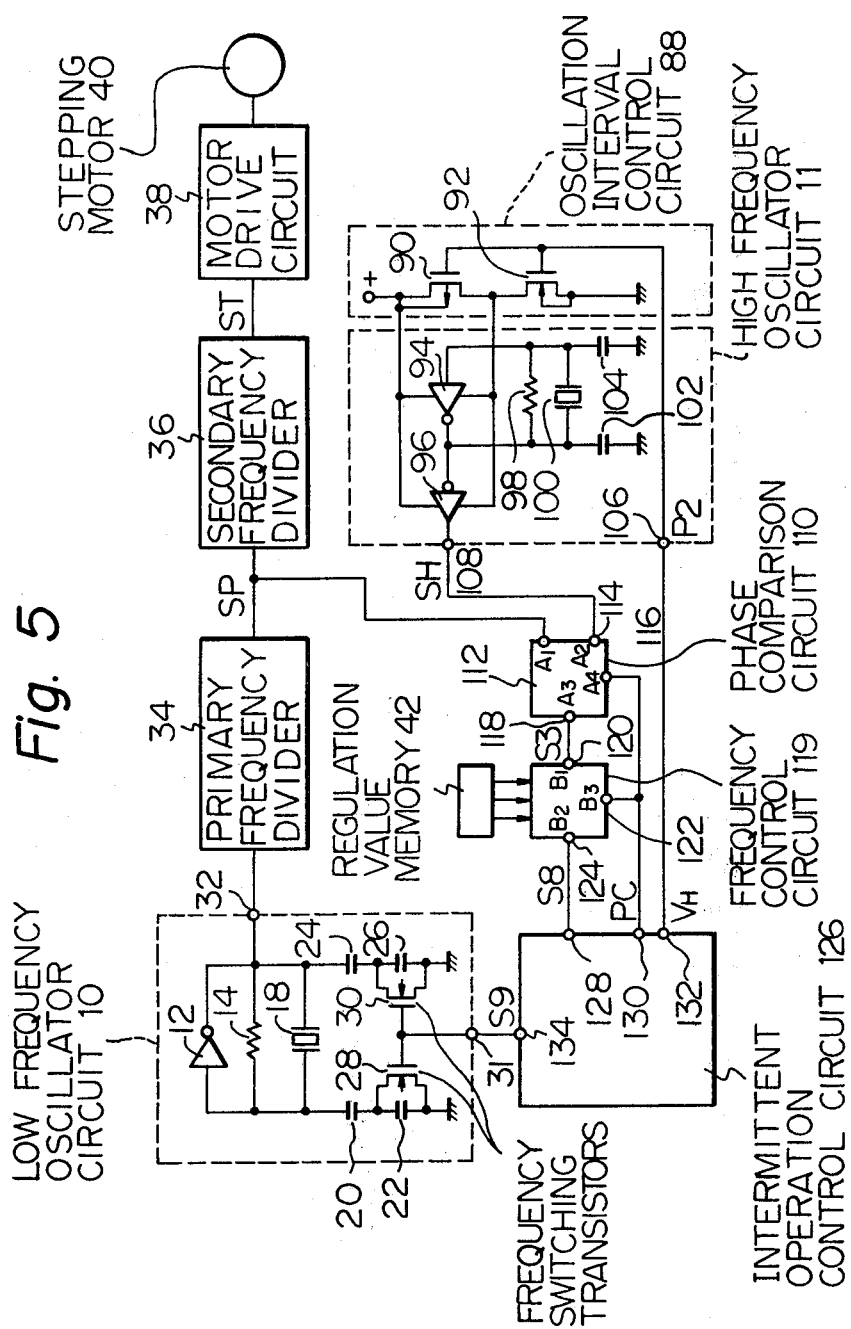
FIG. 5 is a block circuit diagram of an electronic timepiece including a second embodiment of the present invention.

In the embodiment described above, phase lock operation is performed on a continuous basis, with high frequency oscillator circuit 11 being in continuous operation. A second embodiment of the present invention will now be described in which the basis principles of operation are identical to those of the first embodiment, but in which a high frequency quartz crystal oscillator reference signal source is operated in a periodic, intermittent manner, in order to reduce the power consumption of the high frequency oscillator circuit to a minimum. The overall configuration of an electronic timepiece incorporating a second embodiment of a timekeeping signal source according to the present invention is shown in FIG. 5. In FIG. 5, various circuit blocks can be identical in function and structure to circuit blocks in FIG. 1, and are therefore numbered correspondingly. Such circuit blocks are the low frequency oscillator circuit 10, high frequency oscillator circuit 11, primary frequency divider circuit 34, comprising three frequency divider stages, secondary frequency divider circuit 36 comprising 12 frequency divider stages, motor drive circuit 38, stepping motor 40, and regulation value memory 42. However, the embodiment of FIG. 5 also comprises intermittent operation control means consisting of an intermittent operation control circuit 126 and an oscillation interval control circuit 88. In addition, a frequency control circuit 119, although basically similar to frequency control circuit 44 of the first embodiment, is slightly different due to the requirements of intermittent operation of high frequency oscillator circuit 11. Furthermore, in order to provide greater stability of phase comparison, and to reduce fluctuations in the timekeeping rate caused by the intermittent operation of high frequency oscillator circuit 11, a more complex phase comparison circuit than that of the first embodiment is utilized, as denoted by numeral 110.

The functioning of high frequency oscillator circuit 11 will first be described, with reference to FIG. 5. As shown, high frequency oscillator circuit 11 is of well-known type, comprising an oscillation inverter 94 having a feedback resistor 98 and a quartz crystal vibrator 100 connected in parallel between the output and input, an input capacitor 104 coupled between the input of inverter 94 and ground potential, an output capacitor 102 connected between the output of inverter 94 and ground, and a waveform shaping inverter 96, which is coupled to receive the oscillating signal produced by oscillation inverter 94 and to act as a buffer for providing the oscillation signal to other circuitry. The positive power supply terminals of the inverters 94 and 96 are connected to the positive side of the timepiece battery, while the negative power supply terminals of inverters 94 and 96 are connected together to the junction of a PMOS transistor 90 and an NMOS transistor 92, which are connected in series between the positive power supply potential and ground potential. The output signal from inverter 96 is supplied to an output terminal 108. An oscillator control signal VH is supplied from an input terminal 106 to the control gate electrodes of transistors 90 and 92, and comprises a train of "1" logic level pulses which are produced by intermittent operation control circuit 126 as described hereinafter. When oscillation control signal VH is at the "0" logic level, then NMOS transistor 92 is in the OFF state, i.e. is non-conducting, while PMOS transistor 90 is in the ON state. In this condition, therefore, no power is supplied to inverters 94 and 96, and a short-circuit is established across the power supply terminals of these inverters, so that oscillation by high frequency oscillator circuit 11 is inhibited. When oscillation control signal VH goes to the "1" level, then transistor 92 goes to the ON state and transistor 90 to the OFF state, so that power is supplied to inverters 94 and 96, and operation of high frequency oscillator circuit 11 begins. At high frequency reference signal SH, having a frequency fH, is thereby output from terminal 108 for the duration of each "1" logic level pulse of oscillation control signal VH.

Figure 6:
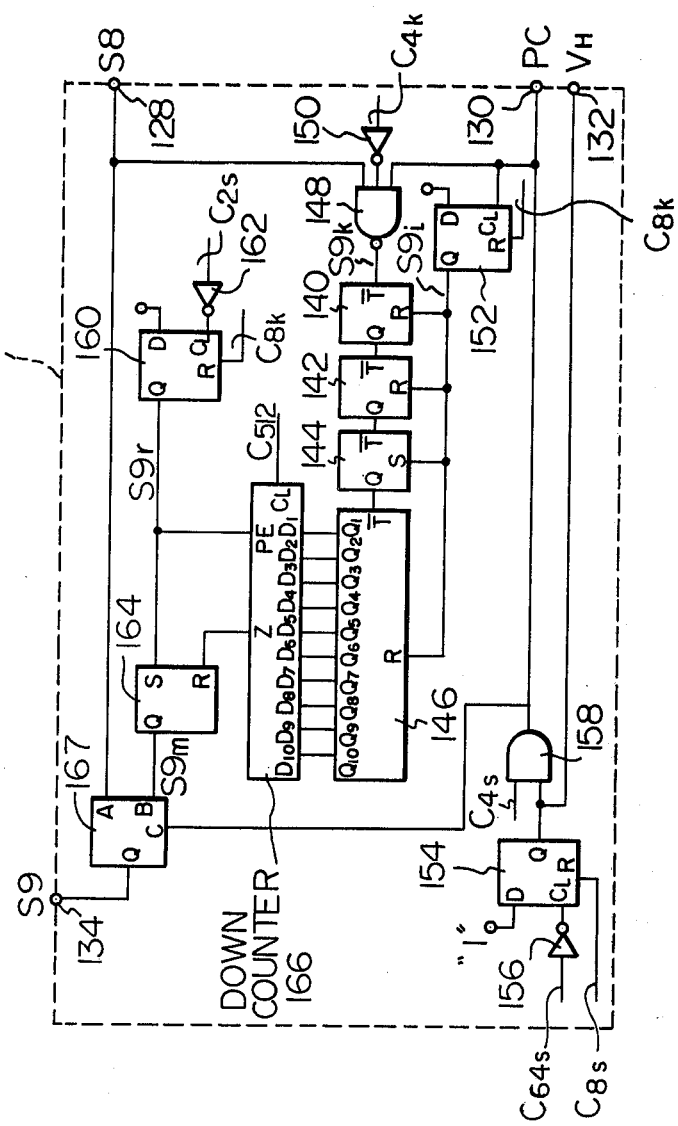
FIG. 6 is a circuit diagram of an intermittent operation control circuit used in the embodiment of FIG. 5.

Referring now to the block circuit diagram of intermittent operation control circuit 126 shown in FIG. 6, the way in which oscillation control signal VH and phase comparison signal PC are generated will first be described. It should be noted that in the following, various clock pulse signals will be referred to having the designations Cns and Cmk, where n and m are positive integers. The designation Cns indicates that the clock pulse signal concerned comprises a pulse train having a period of n seconds. The designated Cmk indicates that the clock pulse signal concerned has a frequency of approximately m kilohertz. These clock signals are variously produced by primary and secondary frequency divider circuits 34 and 36, and therefore have rising and falling edges which are synchronized with signals SL, SP and ST. As shown in FIG. 6, a clock signal C64s, having a period of 64 seconds, is applied through an inverter 156 to the clock input of a DFF 154. A clock signal C8s is applied to the reset terminal R of DFF 154, while the data input D is connected to the "1" logic level potential. The oscillation control signal VH is produced from the Q output of DFF 154, and is coupled to output terminal 132 and also to an input of an AND gate 158, which receives a clock signal C4s at another input thereof. As shown in the timing diagram of FIG. 7A, DFF 154 is set on the falling edge of a C64s clock pulse, whereby oscillation control signal VH goes to the "1" logic level. This is shown as occurring at a time t0 in FIG. 7A. Subsequently, when clock signal C8s goes to the "1" logic level, DFF 154 is reset, whereby oscillation control signal VH returns to the "0" logic level, e.g. at the time t4 in FIG. 7A. Each pulse of oscillation control signal VH is therefore of 4 seconds duration. During the last two seconds of a pulse of signal VH, i.e. while clock signal C4s is at the "1" logic level from t2 to t4 in FIG. 7A, phase comparison signal PC produced by AND gate 158 goes to the "1" logic level. While phase comparison PC is at the "1" logic level, the phase of signal SP from primary frequency divider circuit 34 is compared with the high frequency reference signal SH, as for the first embodiment of FIG. 1. Immediately after operation of high frequency oscillator circuit 11 is initiated by a VH signal pulse, there will be some temporary degree of instability in the frequency of signal SH.

Figure 7A:
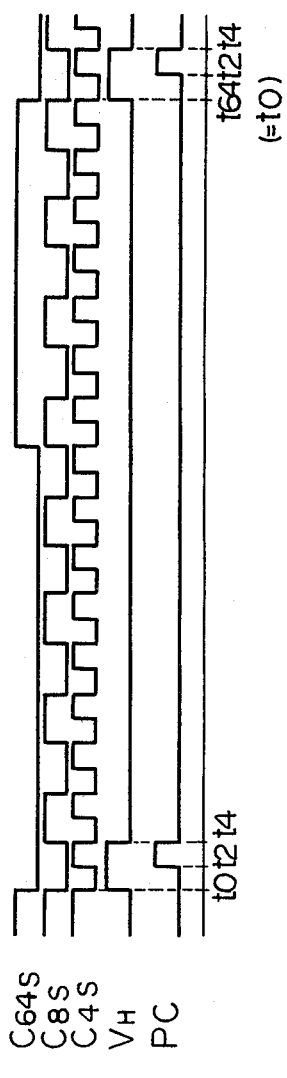
FIGS. 7(A), (B), and (C) are timing diagrams for illustrating the operation of the circuit shown in FIG. 6.

Thus, phase comparison using signal SH does not begin until a predetermined time interval after operation of high frequency oscillator circuit 11 has been started, i.e. after 2 seconds, with the present embodiment, at time t2 shown in FIG. 7A. This ensures that the accuracy obtained by using signal SH as a phase comparison reference signal is not impaired by the intermittent operation of high frequency oscillator circuit 11.

The remainder of intermittent operation control circuit 126 will now be described. In order to facilitate understanding of the following, it may be assumed that phase comparison circuit 110 is of the simplified form shown in FIG. 8, i.e. identical to phase comparator 50 of the first embodiment, comprising a single DFF 170, and that frequency control circuit 119 operates in a similar manner to that described for frequency control circuit 44 of the first embodiment, to produce a frequency control signal S8. Differences which actually exist between the phase comparison circuit and frequency control circuit of the present embodiment and those of the first embodiment will be described hereinafter. However, it will be appreciated that frequency control signal S8 will only be available as an accurate signal during the intervals in which high frequency oscillator circuit is in operation at a stabilized frequency, i.e. during the 2-second interval of each phase comparison signal pulse PC.

Figure 7B:
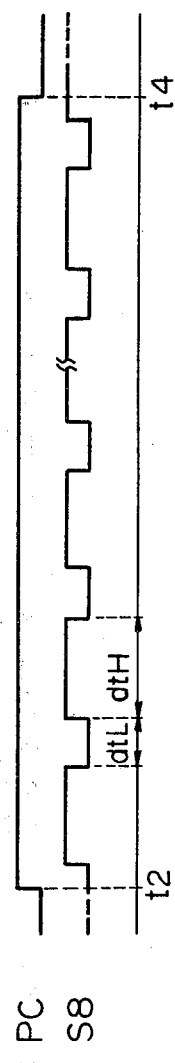

Signal S8 is applied to an input terminal 128 of intermittent operation control circuit 126, and hence to a terminal A of an AB selector switch 167. This selector switch is a component which is widely used, and is a type of electronic controlled switch, having two input terminals A and B, a control terminal C and an output terminal Q. When a control signal applied to terminal C is at the "1" logic level, then the signal being input to terminal A is transferred to output terminal Q. When the control signal applied to terminal C is at the "0" logic level, then the signal being input to terminal B is transferred to output terminal Q. While signal PC is at the "1" logic level, frequency control signal S8 is transferred through AB selector switch 167 to output terminal 134, and is applied as signal S9 to control the frequency switching transistors 28 and 30 of low frequency oscillator circuit 10. Thus, while signal PC is at the "1" logic level, which will be referred to hereinafter as a phase comparison interval, the operation of the embodiment of FIG. 5 is essentially identical to that of the first embodiment of FIG. 1. Thus, a phase lock relationship is established between signal SP (and hence signal SL) with the high frequency reference signal SH, so that the average frequency of signal SL is made almost exactly equal to an integral submultiple of that of signal SH. As explained with respect to the first embodiment, this control of signal SL from low frequency oscillator circuit 10 is achieved by alternately switching the frequency of oscillation of low frequency oscillator circuit 10 between a higher frequency fL2 and a lower frequency FL1, with the average frequency of signal SL being determined by the lengths of the time intervals during which oscillator circuit 10 operates at the higher and lower frequencies fL2 and FL1. This is illustrated in FIG. 7B, by the waveform of frequency control signal S8. During a time interval dtL, signal SL is at the higher frequency fL2, while during an interval dtH, when signal S8 is at the "1" logic signal, signal SL is at the lower frequency fL1. If the duration of interval dtL is increased relative to that of dtH, then the average frequency of signal SL will be increased, so that the timekeeping rate will be advanced. Conversely, if the duration of dtH is increased relative to dtL, then the frequency of signal SL will be effectively decreased, i.e. the timekeeping rate will be retarded. With the present embodiment, frequency control information is memorized during each phase comparison interval, and is used during the subsequent period in which high frequency oscillator circuit 11 is inoperative, to control the frequency of signal SH. This frequency control information is in the form of a binary number, transferred from the higher order 10 stages of a 13-stage counter circuit in which it is memorized as a count value, into down counter circuit 166 as described hereinafter.

A 4 kHz clock signal C4k is input through an inverter 150 to an input of a NAND gate 148. A second input of NAND gate 148 receives the phase comparison signal PC, while the third input receives the frequency control signal S8. Thus, during a phase comparison interval, successive bursts of 4 kHz pulses will be produced by NAND gate 148 in response to successive "1" logic level pulses of frequency control signal S8. These bursts of pulses are input, as signal S9k, to a 13-stage counter comprising TFF 140, TFF 142 and TFF 144, and up-counter circuit 146. Toggle-type flip-flops 140 to 144 are negative-edge triggered, i.e. the output of each changes logic level on the falling edge of a signal applied to the T input. Up-counter 146 is also negative-edge triggered, and has 10 counter stages. Numeral 152 denotes a DFF which receives a clock signal C8k at reset terminal R, phase comparison signal PC at clock input CL, and having a data input D connected to the "1" logic level potential. The output S9i from DFF 152 is applied to the reset terminal R of counter circuit 146 and TFF 140 and 142, and to the set input of TFF 144. It can be seen that each time phase comparison signal PC rises to the "1" logic level i.e. at the start of each phase comparison interval, a single short pulse will be produced by DFF 152 which resets counter 146 and TFF 140 and 142 and sets TFF 144. Only the outputs from the higher order 10 stages of the 13 stage counter are utilized to store frequency control information, i.e. up counter circuit 146, and the initializing performed by the output from DFF 152 serves to provide rounding-off of the count value which is formed in counter 146.

Numeral 166 denotes a 10-stage down counter circuit having a set of data input terminals D1 to D10, which are connected to a corresponding set of data output terminals Q1 to Q10 of up-counter 146, respectively. A DFF 160 has the reset terminal thereof coupled to receive a clock signal C8k, a clock input which receives the inverse of clock signal C2s of 2-seconds period from an inverter 162, and a data input connected to the "1" logic level potential. A single pulse is produced from DFF 160, as signal S9r, once every 2 seconds, i.e. on the falling edge of a C2s signal pulse. Pulse signal S9r is applied to the preset enable terminal PE of down counter circuit 166, and to the set input terminal of a set-reset flip-flop (abbreviated hereinafter to SRFF) 164. The zero-detection output Z of down counter 166 is coupled to the reset terminal of SRFF 164. An output signal S9m, referred to hereinafter as the expanded frequency control signal S9m, is applied to a B input of AB selector 166.

Figure 7C:
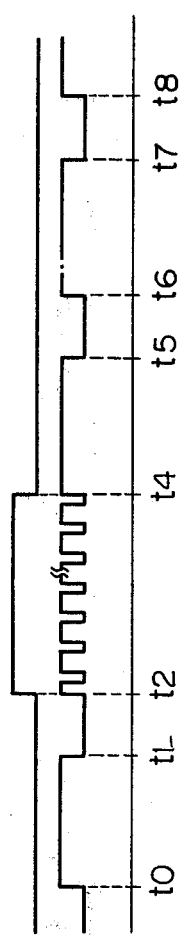

At the start of each phase comparison interval, the states of TFF 140 to 144 and up-counter 146 are initialized by signal S9i, as described above. Thereafter, during successive intervals in which signal S8 is at the "1" logic level, e.g. interval dtH shown in FIG. 7B, bursts of pulses from NAND gate 148 are counted by counter 146 and TFFs 140 to 144, with the number of pulses in each such burst being proportional to the duration of a corresponding dtH interval. At the end of the phase comparison interval, signal PC goes to the "0" logic level so that NAND gate 148 is inhibited. A count value is now left stored in up-counter 146, with the magnitude of this count value being proportional to time interval dtH of signal S8 (or rather, to the total of such time intervals occurring during the phase comparison interval). At this time, i.e. time t4 shown in FIG. 7A to 7C, a pulse is output by DFF 160, which sets DFF 164 so that signal S9m goes to the "1" logic level. This pulse from DFF 160 also presets the contents of up-counter 146 into down-counter 166, which then begins counting down in response to a clock signal C512 of 512 Hz which is applied to clock input CL. Down counter 146 is of identical type to down counter 70 described above for the first embodiment, so that when preset occurs, and the count value in down counter 146 becomes other than zero, the output from zero detection terminal Z goes to the "0" logic level. Also at time t4, when phase comparison signal PC goes to the "0" logic level, AB selector 167 responds by isolating signal S8 from output terminal 134, and applying the expanded frequency control signal S9m from SRFF 164 thereto, as signal S9. Thus, signal S9 goes to the "1" logic level at time t4, as shown in FIG. 7C. This condition is continued until down counter 166 reaches a count of zero, upon which the output from terminal Z thereof goes to the "1" logic level. Expanded frequency control signal S9m thereby goes to the "0" logic level, at a time t5. Subsequently, at a time t6, when another pulse is output from DFF160 (2 seconds after time t4), the contents of up-counter 146 are again set into down counter 166. The cycle of operations described above, from t4 to t6 is then repeated, from t6 to t8, and is repeated during successive 2-second intervals.

The above operations will be explained in greater detail with reference both to the timing diagram of FIG. 3 and FIG. 7. During 4 seconds in a 64 second interval, power is supplied to high frequency oscillator circuit 11. During the last 2 seconds of this 4 second interval, phase comparison signal PC is at the "1" logic level, i.e. during the time from t2 to t4 shown in FIG. 7(A) to (C), so that phase lock operation is in progress. Thus, during such an interval, frequency changeover signal S9 is identical to frequency control signal S8. In the following, the time interval dtH shown in FIG. 7(B) will be considered to correspond to the time interval from t5 to t2 of FIG. 3, while the interval dtL of FIG. 7(B) will be considered to correspond to the interval from t2 to t5 in FIG. 3, i.e. while signal S8 is at the "0" logic level. The frequency of signal SL from low frequency oscillator circuit 10 will be designated as $fL_i$, and a deviation of this frequency from a standard value of $fH/128$, in units of parts-per-million, will be designated as $PPm_i$. Thus:

$$fL_i = fH/128 \times (1 + PPm_i + 10^{-6}) \quad (11)$$

Signal SL is passed through a 3-stage primary frequency divider to produce signal SP, whose frequency will be designated as $fP_i$.
Thus:

$$fP_i = fL_i/8 \quad (12)$$

During the interval from t5 to t2, the low frequency oscillator circuit output is at the lower frequency fL1. If the number of pulses of signal SP during the latter interval is denoted as rH, then the duration of the time interval from t5 to t2 is given as:

$$dtH = rH/fP_i = rH \times 8/fL1 \quad (13)$$

As shown in FIG. 3(A), the rising edge of signal SP moves from a position slightly to the left of a Px pulse, to a position slightly to the right of a Px pulse, during the time interval from t5 to t2. If the total amount of phase shift of signal SP during the interval from t5 to t2 is assumed to be close to $1/(2 \times fH)$, then the following equation is obtained:

$$dtH = 1/fH \times 1024 \times rH + 1/(2 + fH) \quad (14)$$

From the above equations, rH can be approximately calculated to obtain the following value:

$$rH = -500/PPm1 \quad (15)$$

where PPm1 is the deviation of low frequency signal SL from the standard frequency value when SL is at the lower frequency fL1.

Similarly, if a number of pulses rL of signal SP is assumed to occur during the interval from t2 to t5, then the duration of this interval t2 to t5 is given as:

$$dtL = rL/fP_i = rL \times 8/fL2 \quad (16)$$

If the phase shift of signal SP relative to SH during the interval from t2 to t5 is assumed to be close to $-1/(2\times fH)$, then the following equation can be obtained:

$$dtL \times 1/fH \times 1024 \times rL - 1/(2\times fH) \quad (17)$$

Thus, from the above equations, the value of rL is obtained as:

$$rL = 500/PPm2 \quad (18)$$

where PPm2 is the deviation of low frequency signal SL from the standard frequency when SL is at the higher frequency fL2.

The above can be summarized as follows. During one period of frequency control signal S8, a number of pulses rH and a number rL of primary frequency division signal SP occur while signal S8 is at the "1" and "0" logic levels respectively. As shown above, it can be deduced that $rH = -500/PPm1$ and $rL = 500/PPm2$ where PPm1 and PPm2 are the deviations of low frequency signal SL from the standard frequency when signal SL is at the lower frequency fL1 and high frequency fL2 respectively. Using specific values as an example, if PPM1=25 and PPM2=50, then rH=500/25 =20, and rL=500/50=10. Thus, dtH:dtL=rH:rL=2:1. This ratio between dtL and dtH is, in effect, stored in down counter 166 at the end of a phase comparison interval, and thereafter is used as frequency control information to determined the ratio for which low frequency signal SL is at the higher and lower frequencies fL2 and fL1 respectively during each of the succeeding 2-second intervals t4 to t6, t6 to t8, and so on, as described previously. Thus, the frequency control information stored in counter 166 serves to control the operation of low frequency 10 in a time-sharing manner during successive 2-second intervals which occur after one phase comparison interval, until the start of the next phase comparison interval. The timekeeping rate during the intervals in which high frequency oscillator circuit 11 is inoperative is therefore accurately controlled on the basis of frequency control using high frequency oscillator circuit 11.

Figure 8:
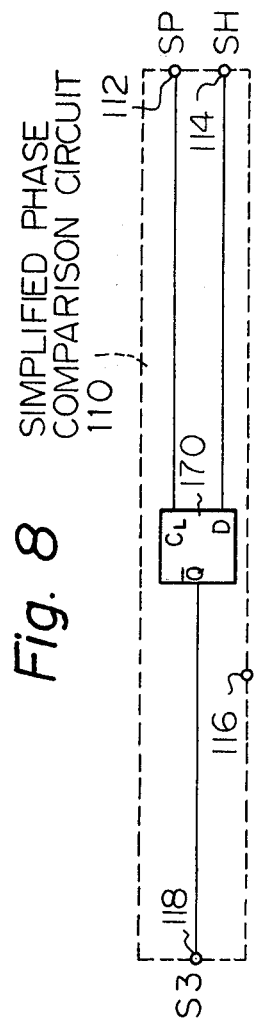
FIG. 8 is a circuit diagram of a simplified version of a phase comparison circuit used in the embodiment of FIG. 5.

As stated hereinabove, it is helpful to consider that a simple phase comparison circuit of the form shown in FIG. 8 is used in the present embodiment, in order to facilitate understanding of other portions of the circuitry. However in fact a rather more complex phase comparison circuit is used, of the form shown in FIG. 9. This circuit has the advantage of providing more rapid attainment of a full phase lock condition, after phase comparison of signals SP and SH begins, as compared with the simple circuit of FIG. 8. Such a rapid phase lock capture is necessary due to the short duration of each phase comparison interval, i.e. 2 seconds in this embodiment. If complete phase lock is attained quickly, i.e. shortly after the start of this interval, then frequency control information stored into down counter 166 of intermittent operation control circuit 126 will be highly accurate. Another advantage of the phase comparison circuit of FIG. 9 is that the phase comparison process is stabilized against deviations caused by external interference, noise, etc., thereby further assuring the accuracy of the frequency control information produced during a phase comparison interval.

Figure 9:
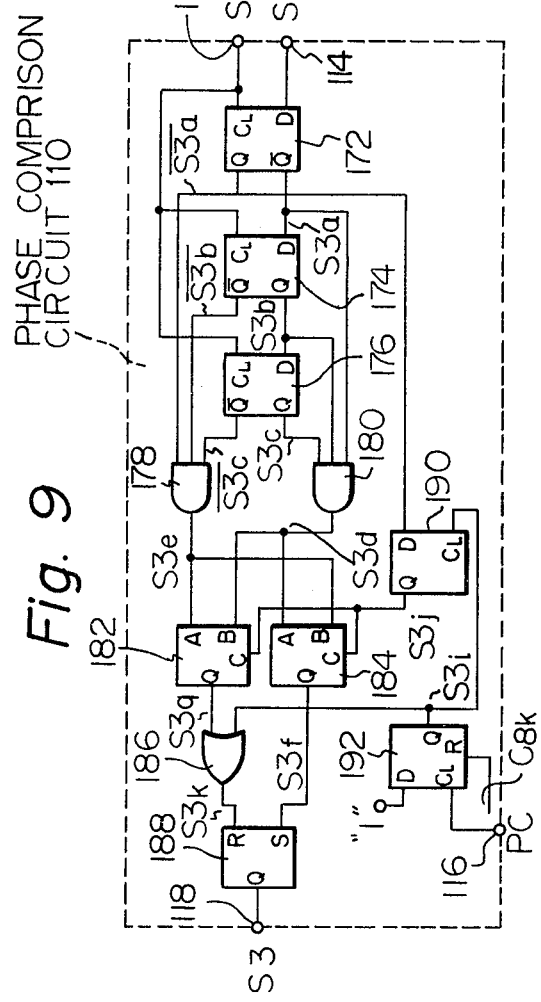
FIG. 9 is a circuit diagram of a practical version of a phase comparison circuit used in the embodiment of FIG. 5.

Referring now to FIG. 9, numerals 172, 174 and 176 denote three data-type flip-flops connected in series. The function of DFF 172 is similar to that of DFF 170 in the simplified phase comparison circuit of FIG. 8. High frequency signal SH is connected to data input terminal D, while signal SP from primary frequency divider 34 is applied to clock input terminal CL, so that high frequency signal SH is periodically sampled on each rising edge of signal SP. Thus, output signal S3a from output Q of DFF 172 corresponds to phase signal S3 of the simplified phase comparison circuit of FIG. 8. If signal SH is at the "0" logic level at the time of a rising edge of signal SP, then output signal S3a goes to the "1" logic level, while if signal SH is at the "1" logic level at the rising edge of signal SP, then signal S3a goes to the "0" logic level. DFF 174 and 176 are connected in series, to act as a two-stage shift register. Signal S3a from output terminal Q of DFF 172 is connected to the data input terminal D of DFF 174, whose clock input terminal CL receives the signal SP. The Q output from DFF 174, i.e. signal S3b is applied to the data input terminal D of DFF 176, while signal SP is also applied to the clock input terminal of DFF 176. The Q output from DFF 176, signal S3c, is input, together with signals S3a and S3b, to a 3-input AND gate 180. Similarly, the inverse signals to S3a, S3b and S3c, i.e. $\overline{S3a}$, $\overline{S3b}$ and $\overline{S3b}$ from the $\overline{Q}$ output of DFF 172, and the $\overline{Q}$ terminals of DFFs 174 and 176 respectively, are input to a 3-input AND gate 178. Each time signal SP rises to the "1" logic level while signal SH is at the "0" logic level, output Q of DFF 172, i.e. signal S3a, goes to the "1" logic level. If this condition occurs for three successive periods of signal SP, then it can be seen that the output of AND gate 180, i.e. signal S3d, will go to the "1" logic level. Similarly, if signal SP rises to the "1" logic level at the time when signal SH is at the "1" logic level, e.g. during a pulse Px as shown in the waveform diagram of FIG. 3, then output Q of DFF 172, i.e. signal S3a, will go to the "1" logic level. If this condition occurs for three successive periods of signal SP, then it can be seen that all of the inputs to AND gate 178 will go to the "1" logic level, so that signal S3e will go to the "1" logic level, with signal S3d at the "0" logic level. Signals S3d and S3e therefore indicate successive changes in the phase relationship between signals SP and SH in a very reliable and stabilized manner, since fluctuations in phase comparison resulting from electrical noise or other effects of an intermittent nature are eliminated. For this reason, signals S3e and S3d will be referred to as the first and second stabilized phase signals, respectively. Numerals 182 and 184 denote AB selector switches, of the type described hereinabove with reference to the intermittent operation control circuit 126. Signal S3e is applied to the A input terminal of AB selector 182, and to the B input terminal of AB selector 184, while signal S3d is applied to the B input terminal of AB selector 182, and to the A input of AB selector 184. The output signal from AB selector 182, designated as S3g, is applied to one input of an OR gate 186, while the Q output of AB selector 184, denoted as S3f, is applied to the set input terminal of SRFF 188. The output of OR gate 186 is applied to the reset input terminal R of SRFF 188.

Numeral 192 denotes a DFF having the data input terminal connected to the "1" logic level potential, the clock input terminal CL coupled to receive phase comparison signal PC, and the reset input terminal R coupled to receive a clock signal $C_{8K}$. DEF 192 serves to produce a single pulse on the rising edge of each PC signal pulse, i.e. at the start of each phase comparison interval. This one-shot pulse signal is denoted as S3i, and will be referred to as the phase comparison start signal. This phase comparison start signal S3i is applied to the other input of OR gate 186, and also to the clock input terminal CL of a DFF 190. Signal $\overline{S3a}$ from the Q output of DFF 172 is supplied to the data input terminal D of DFF 190, which produces a signal S3j from output Q, which will be referred to as the phase comparison initializing signal. Signal S3j is applied to the control input terminals C of AB selectors 182 and 184.

Before describing the operation of the phase comparison circuit of FIG. 9, the concept of phase lock with respect to a region of signal SH will be explained. In the previous description of a simple phase comparison circuit with reference to the first embodiment of the present invention, phase lock between signals SP and SH was described as being established with respect to successive rising edges of signal SP and repetitively occurring pulses Px of signal SH (as shown in FIG. 3). In that example, the frequency of signal SL from low frequency 10, and hence that of signal SP from primary frequency divider circuit 34, is maintained such that successive rising edges of signal SP occur while signal SH is at the "1" logic level, i.e. during successive pulses Px of signal SH. However, it is equally possible to establish a phase lock condition between signals SP and SH such that successive rising edges of signal SP occur during periodically recurring intervals when signal SH is at the "0" logic level. Thus, such a periodically recurring state of signal SH to which phase lock with signal SP is established (e.g. pulse Px shown in FIG. 3) can be referred to generally as a "region" of signal SH. With the phase comparison circuit 110 of FIG. 9, phase lock between signals SP and SH is established with respect to either a "1" logic level or a "0" logic level region of signal SH, depending upon the phase relationship between signals SP and SH at the start of a phase comparison interval.

The reason for this capability is that there is no fixed relationship between the phase of signal SH at the start of each phase comparison interval and that at the end of the preceding phase comparison interval, due to the fact that operation of high frequency oscillator circuit 11 is halted between such phase comparison intervals. Thus, in order to establish phase lock between signals SP and SH as rapidly as possible after the commencement of a phase comparison interval, phase lock is established with respect to a "1" logic level region of signal SH if signal SH is at the "1" logic level at the start of a phase comparison interval, while phase lock is established with respect to a "0" logic level region of signal SH if signal SH is at the "0" logic level at the start of a phase comparison interval. With the phase comparison circuit example used in the first embodiment, however, and described hereinabove, phase lock is always established with respect to a "1" logic level region of signal SH (i.e. the Px pulses of signal SH).

Figure 10:
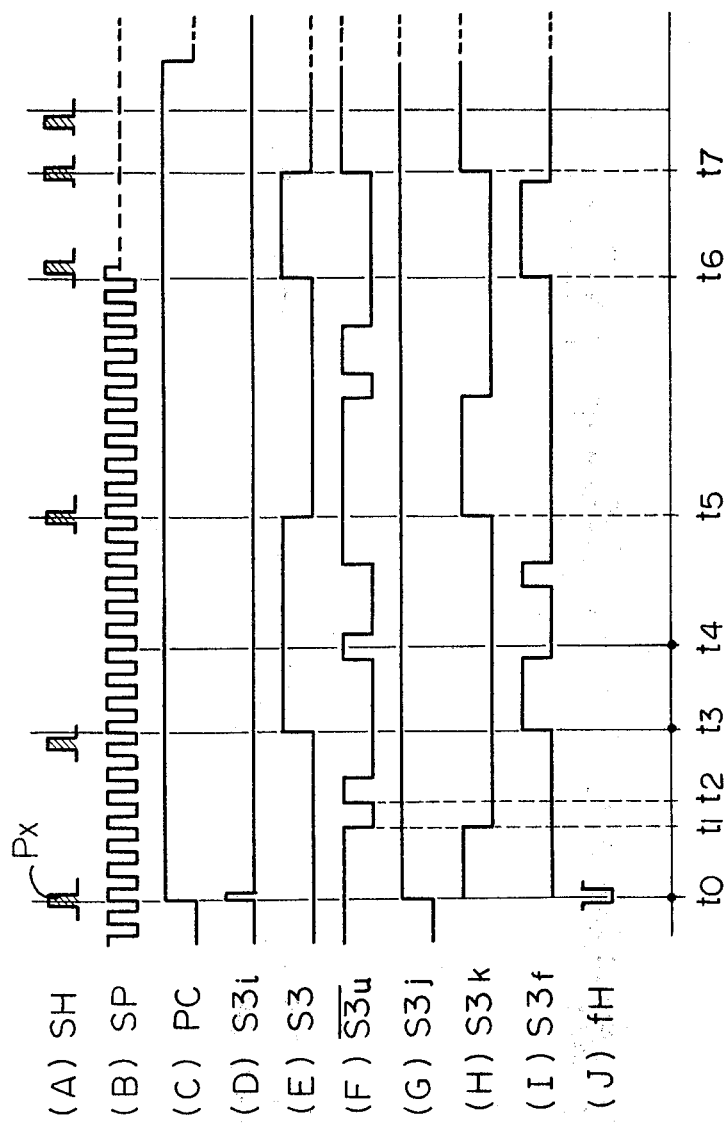
FIG. 10 is a timing diagram for aid in understanding the operation of the circuit of FIG. 9.

Referring now to FIG. 9 and the timing diagram of FIG. 10, FIG. 10(A) shows the waveform of periodically occuring pulses Px to which phase lock is established (i.e. a "1" logic level region of signal SH). FIG. 10(B) shows the waveform of signal SP. FIG. 10(C) shows signal PC. FIG. 10(D) shows the phase comparison start signal S3i. FIG. 10(E) shows the phase signal $\overline{S3}$, produced by SRFF 188. FIG. 10(F) shows signal S3a. FIG. 10(G) shows the phase comparison initializing signal S3j. FIG. 10(H) shows the output signal S3k from OR gate 186. FIG. 10(I) shows the waveform of signal S3f from AB selector 184. FIG. 10(J) illustrates a condition of signal SH for which phase lock to a "0" logic level region will be established.

At time t0 in FIG. 10, the rising edge of signal PC (and hence signal SP) occurs, i.e. a phase comparison interval is initiated, during a "1" logic level region of signal SH. At this time, a pulse S3i is output from DFF 192, as the phase comparison start signal. This is transferred through OR gate 186 to the reset input terminal R of SRFF 188. Thus, irrespective of the previous logic level state of signal S3g from AB selector 182, phase signal S3 is unconditionally set to the "0" logic level at the start of a phase comparison interval. Also at time t0, signal S3a is at the "1" logic level, so that phase comparison initializing signal S3j from DFF 190 goes to the "1" logic level in response to the phase comparison start signal pulse S3i. As a result of this condition of phase comparison initializing signal S3j, the output signal S3e from AND gate 178 is transferred to the Q output AB selector 182, as signal S3g, and signal S3g from AND gate 180 is transferred to the Q output of AB selector 184, to appear as signal S3f. In FIG. 10 it is assumed that signal $\overline{S3a}$ goes to the "0" logic level at a time t1, so that stabilized phase signal S3e, and hence signal S3k, go to the "0" logic level as indicated in FIG. 10(H). Subsequently, at time t2, signal S3a again goes to the "1" logic level, however since this only persists for a single period of signal SP, the output signals from DFF 176 and 174 ensure that the stabilized phase signal S3e, and hence signal S3k, remain at the "0" logic level.

Subsequently, by time t3, three successive rising edges of signal SP have occurred while signal SH is at the "0" logic level, so that stabilized phase signal S3a goes to the "1" logic level, as does signal S3f, as shown in FIG. 10(I). SRFF 188 is thereby set, so that phase signal S3 rises to the "1" logic level. Next, by time t5, three successive rising edges of signal SP have occurred while signal SH is at the "1" logic level so that the stabilized phase signal S3e, and hence the signal S3k, go to the "1" logic level. SRFF 188 is thereby reset, so that phase signal S3 returns to the "0" logic level. The above sequence of events is repeated thereafter, such as at times t6 and t7, when phase signal S3 goes to the "1" and to the "0" logic levels respectively, in response to rising edges of signals S3f and S3k.

It can thus be understood that, after a phase comparison interval has been initiated by a phase comparison PC signal, the circuit shown in FIG. 9 serves to perform a similar phase comparison function to the simple circuit of FIG. 8, but in a more accurate manner as a result of the stabilized phase signals S3d and S3e, which eliminate errors in phase comparison judgement being caused by such factors as electrical noise. The circuit assembly constituted by DFFs 172, 174 and 176. in conjunction with AND gates 178 and 180, therefore serves as a phase comparison stabilization circuit.

The function of the AB selectors 182 and 184 will now be described. If signal SH is at the "0" logic level at the rising edge of phase comparison signal PC (and hence signal SP), as illustrated by FIG. 10(J), then the phase start signal S3i from DFF 182 will set signal S3j at the "0" logic level at time t0. Signal S3j will remain at this level throughout the subsequent phase comparison interval. As a result, stabilized phase signal S3e from AND gate 178 will now be transferred to the Q output of AB selector 184, as signal S3f, while the stabilized phase signal S3d from AND gate 180 will be transferred through AB selector 182 to appear as signal S3g, and hence signal S3k from OR gate 186. In the phase comparison circuit of FIG. 9, as in that of the first embodiment, signal S3 goes to the "1" logic level when it is detected that a rising edge of signal SP occurs outside the region of signal SH to which phase lock is being established. For the case shown in FIG. 10(A), this region will be a pulse of signal SH, as denoted by Px. If however signal SH is as shown in FIG. 10(J) at the start of a phase comparison interval, then the phase lock region of signal SH will be a periodically occurring interval when signal SH is at the "0" logic level. Thus, signal S3g from AB selector 182, which serves to reset SRFF 188 so that phase signal S3 goes to the "0" logic level, can be designated as an in-region signal, which serves to indicate that rising edges of signal SP have started to coincide with the phase lock region that has been determined at the start of a phase comparison interval. Similarly, signal S3f from AB selector 184, which serves to set SRFF 188 so that phase signal S3 goes to the "1" logic level, can be designated as an out-of-region signal, which indicates that the rising edges of signal SP have started to occur outside the phase lock region. The logic level of initializing signal S3j after the start of a phase comparison interval serves to determine whether signals S3e or S3d shall constitute the in-region signal or out-of-region signal during that phase comparison interval, by controlling changeover operation of AB selectors 182 and 184. For this reason, the circuit assembly comprising AB selectors 182 and 184, together with DFF 190, constitute a phase lock region changeover circuit.

From the above, it can be understood that phase lock can be established with respect to either a "1" or "0" logic level region of signal SH, in accordance with the phase relationship between signals SH and SP at the instant when a phase comparison interval begins. Because of this, phase lock between these signals can be established very rapidly, as compared with an arrangement in which phase comparison is always performed with respect to a fixed region of signal SH, i.e. with respect to pulses Px as for the phase comparison circuit of the first embodiment described previously.

Figure 11:
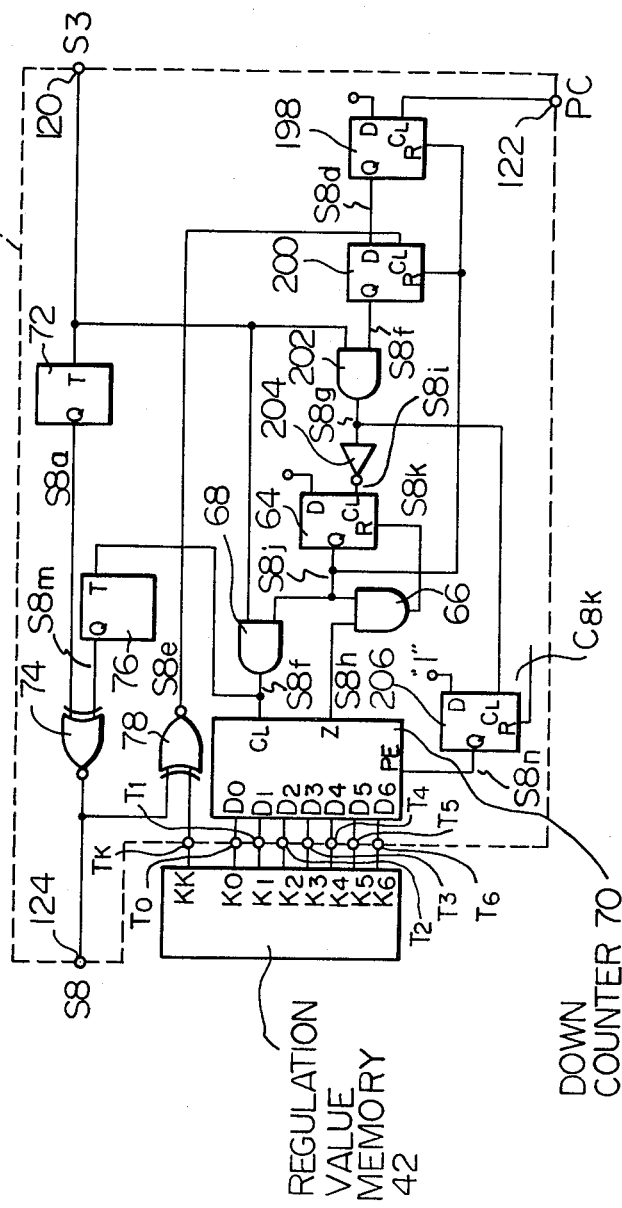
FIG. 11 is a circuit diagram of a frequency control circuit which is used in the embodiment of FIG. 5.
Figure 12:
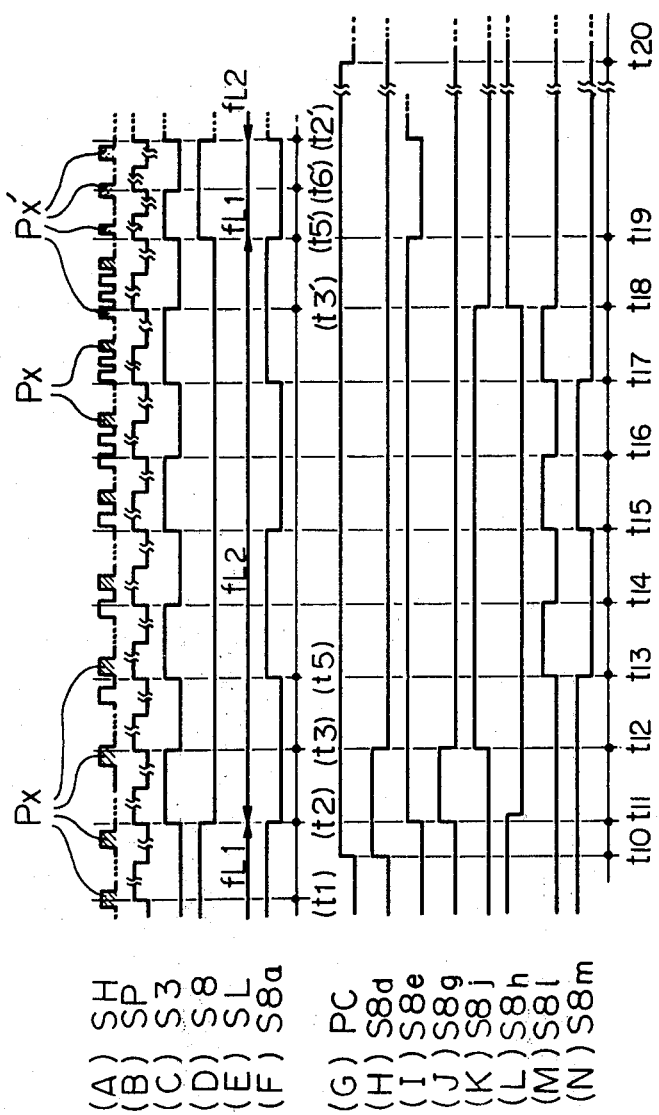
FIG. 12 is a timing diagram for illustrating the timekeeping rate adjustment operation of the embodiment of FIG. 5.

Referring now to FIG. 11, the frequency control circuit 119 and regulation value memory 42 of the second embodiment are shown. As can be seen, this is very similar to the frequency control circuit and regulation value memory of the first embodiment. The only difference lies in the method whereby the timekeeping rate adjustment interval Ti is determined. In the first embodiment, the duration of Ti was equal to the period of a regulation signal S8c, produced by frequency division of the one-second timekeeping signal ST in a frequency divider 54. However with the second embodiment, the timekeeping rate adjustment interval is equal to the duration of a period for which phase comparison signal PC is at the "1" logic level. This can be understood by referring to the timing diagram of FIG. 12, in conjunction with FIG. 11. As shown in FIG. 11, phase comparison signal PC is applied to the clock input terminal CL of a DFF 198, which corresponds to DFF 56 of the first embodiment, shown in FIG. 2. Thus, a regulation processing start signal S8d is generated, comprising a pulse which begins on the rising edge of signal PC. Since the circuitry which receives this regulation processing start signal S8d, and which also receives the phase signal S3 from input terminal 120, is identical to that of the frequency control circuit 44 of the first embodiment, the operation following generation of a regulation processing start signal pulse is identical for both the frequency control circuits 56 and 119 of the first and second embodiments respectively. This can be seen by the timing diagram of FIG. 12, in which it is assumed that a value of +3 is held in the regulation value memory 42, as in the description of the operation of the frequency control circuit of the first embodiment.

Each interval when phase comparison signal PC is at the "1" logic level is of 2 seconds duration, so that the timekeeping rate adjustment interval Ti is equal to 2 seconds. Since the standard frequency of high frequency oscillator signal SH is 4,194,304 Hz, the standard number of high frequency pulses Ro is given as 8,388,608. Thus, the timekeeping rate adjustment resolution $\Delta$ is given by equation (9) as 1/8,388,608, i.e. as approximately 0.12 ppm. As described for the first embodiment, the regulation value K can vary in the range from $-127$ to $+127$, so that it can be seen, from equation (10), that the range of adjustment of the timekeeping rate is approximately $\pm 15$ ppm.

Figure 13:
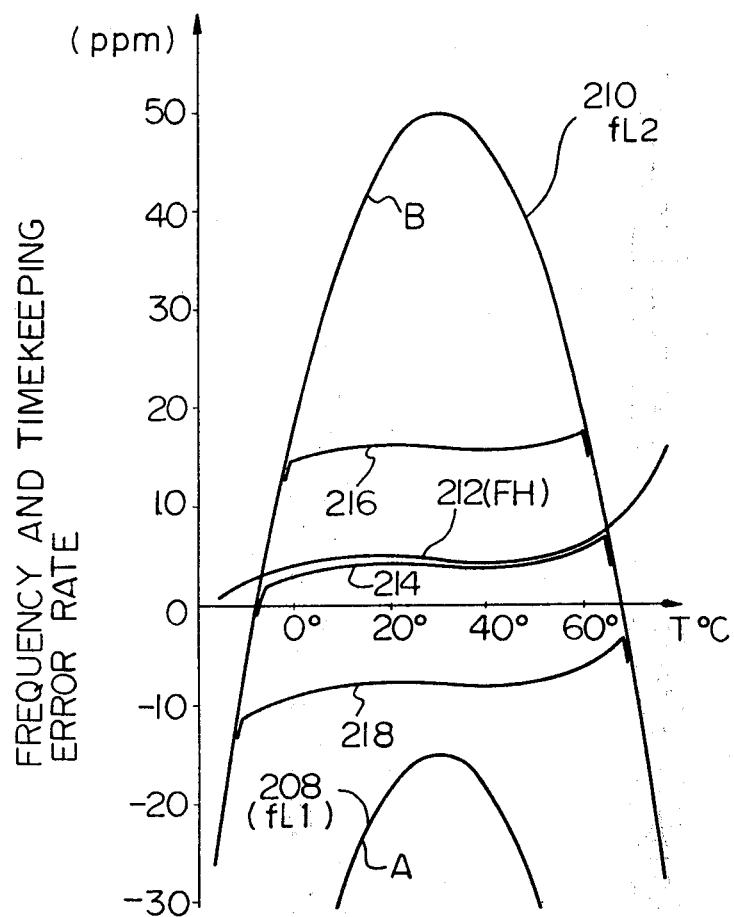
FIG. 13 is a set of graphs illustrating the frequency deviation/temperature characteristics of output signals from a low frequency oscillator circuit of a timekeeping signal source according to the present invention, both with frequency control applied and without frequency control, and the frequency deviation/temperature characteristic of a high frequency oscillator circuit in a timekeeping signal source according to the present invention.

Referring now to FIG. 13, frequency and timekeeping error rate characteristics with respect to temperature are shown, which are typical of a timekeeping signal source according to the second embodiment of present invention. Numeral 208 and 210 denote the frequency deviation characteristics (i.e. for a deviation $\Delta f$ with respect to a predetermined center frequency value $f_0$) with respect to temperature of the output signal from low frequency oscillator circuit 10, at the lower frequency fL1 and the higher frequency fL2 respectively. Numeral 212 denotes the frequency deviation characteristic of the high frequency signal SH with respect to temperature. Numeral 214 denotes the temperature characteristic of the timekeeping error rate S, when phase lock operation is being performed, with a regulation value K of zero. Numerals 216 and 218 show the temperature characteristics of the timekeeping error rate S for a regulation value K of $+100$ and $-100$ respectively. As can be seen, the characteristics 216 and 218 are equivalent to transfer of characteristic 214 in a direction parallel to the vertical axis. The timekeeping adjustment resolution is assumed to be equal to that of the second embodiment described above, i.e. approximately 0.12 ppm. Thus, characteristic 216 is equivalent to moving characteristic 214 upward by an amount 12 ppm, while characteristic 218 is equivalent to moving characteristic 214 downward by 12 ppm.

As can be seen, characteristics 214 to 218 cease to correspond to characteristics 212 outside a certain range of temperatures. This is due to the fact that the relationship fL1 < fH/m < fL2 is not satisfied outside that range of temperatures. It will also be observed that there is a slight deviation between characteristic 212 and 214. This is due to the fact that the frequency of oscillation of high frequency oscillator circuit 11 during the timekeeping rate adjustment interval, for the case of intermittent operation of the high frequency oscillator circuit, is not precisely identical to the oscillator frequency for the case in which high frequency oscillator 11 is operating continuously. This deviation can be made as small as required, however, by suitable design. However such a deviation will not present a problem, in practice, since adjustment to set the timekeeping error rate to zero is performed on the basis of the characteristic 214.

Although the characteristics 214, 216 and 218 are drawn as smooth curves, there will in fact be slight fluctuations in these curves, caused by the fact that the phase of signal PC, which initiates a phase comparison interval, is not fixed with respect to the high frequency signal SH, as described previously. However the maximum value of such fluctuations will be of the order of $1/(4\times 10^6)/2$ sec i.e. approximately 0.125 ppm.

It should be noted that it is possible to make the temperature characteristic of a timekeeping signal source according to the present invention superior to that of the high frequency oscillator signal. This can be done by making the regulation value K held in the regulation value memory vary with respect to temperature, in such a way as to compensate for the temperature characteristic of the high frequency oscillator signal, i.e. to thereby make curves 214, 216 and 218 in FIG. 13 become substantially parallel to the temperature axis. This can be done by coupling temperature detection means to the regulation value memory 42, such that information from the temperature detection means suitably alters the regulation value K in response to temperature variations.

From the above description of embodiments of the present invention, it can be understood that a timekeeping signal source for an electronic timepiece according to the present invention enables the timekeeping rate of an electronic timepiece to be controlled to a high degree of accuracy by means of a high frequency quartz crystal oscillator, without frequency division of the output signal from the high frequency oscillator being necessary. In addition, the present invention further enables the timekeeping rate of the timepiece to be adjusted to set the timekeeping error rate close to zero, by means of a numeric value set into digital memory means, with the resolution of such timekeeping rate adjustment being less than one period of the high frequency oscillator signal frequency. In addition, the operation of the high frequency oscillator circuit can be carried out on an intermittent basis, with the timekeeping rate of the timepiece during an interval in which the high frequency oscillator is inoperative being determined on the basis of information generated during a preceding interval of operation of the high frequency oscillator. Thus, a timekeeping signal source according to the present invention provides the advantages of utilizing a high frequency quartz crystal oscillator circuit as a frequency standard, without a significant increase in power consumption being caused thereby, by comparison with a conventional electronic timepiece utilizing a low frequency quartz crystal oscillator circuit as a frequency standard. Furthermore, a timekeeping signal source according to the present invention enables timekeeping rate adjustment to be performed without the necessity for a trimming capacitor such as is commonly used in the prior art, thereby greatly improving the long-term timekeeping rate stability of an electronic timepiece using such a timekeeping signal source.

From the preceding description, it will be apparent that the objective set forth for the present invention are effectively attained. Since various changes and modifications to the above construction may be made without departing from the spirit and scope of the present invention, it is intended that all matter contained in the above description or shown in the drawings shall be interpreted in an illustrative and not in a limiting sense. The appended claims are intended to cover all of the generic and specific features of the invention described hereinabove.

What is claimed is:

1. A timekeeping signal source for an electronic timepiece, comprising:

low frequency oscillator circuit means including frequency changeover means for switching the frequency of oscillation thereof at least between a higher and a lower frequency;

high frequency oscillator circuit means having a frequency of oscillation which is an integral multiple of a frequency intermediate between said higher and lower frequencies of oscillation of said low frequency oscillator circuit means;

primary frequency divider circuit means for frequency dividing an output signal produced by said low frequency oscillator circuit means, to thereby produce a primary frequency division signal;

secondary frequency divider circuit means for frequency dividing said primary frequency division signal, to thereby produce a timekeeping signal;

phase comparison means for comparing the phase of said primary frequency division signal with the phase of an output signal from said high frequency oscillator circuit means, to produce a phase signal comprising a train of pulses;

timekeeping rate setting means for producing timekeeping rate setting information to designate an amount of adjustment of the timekeeping rate of said electronic timepiece; and frequency control circuit means coupled to receive said phase signal and said timekeeping rate setting information, comprising bistable circuit means coupled to receive said phase signal for thereby producing a basic frequency control signal, inhibit gate circuit means for transferring said basic frequency control signal to be output as a frequency control signal, and counter circuit means periodically enabled to count pulses of said phase signal to produce an output signal which is applied to said inhibit gate circuit means to inhibit transfer of said basic frequency control signal to said frequency changeover means, said inhibit operation being continued during a time interval in which a number of pulses of said phase signal are counted, said number of pulses being determined in accordance with said timekeeping rate setting information, said frequency control signal being applied to said frequency changeover means for thereby selectively setting said low frequency oscillator circuit means frequency of oscillation to said higher and lower frequencies thereof, whereby adjustment of said timekeeping rate is performed by said frequency control signal being held at a fixed potential during said time interval to thereby fix the frequency of oscillation of said low frequency oscillator circuit means output signal at one of said higher and lower frequencies thereof during said time interval.

2. A timekeeping signal source according to claim 1, in which said frequency control circuit means further comprises regulation processing control circuit means for generating a regulation processing signal to indicate that said regulation processing is in progress, said regulation processing control signal being initiated in synchronism with a pulse of said phase signal and being terminated by a count termination signal produced by said counter circuit means when said number of pulses of the phase signal designated by the timekeeping rate setting information have been counted, said inhibit gate means being controlled by means of said regulation processing control signal.

3. A timekeeping signal source according to claim 2, in which said timekeeping rate setting information includes a regulation sign bit signal comprising a binary signal which is set to a first logic level to indicate that the timekeeping rate of the timepiece is to be advanced and is set to a second logic level to indicate that the timekeeping rate is to be retarded, and in which said frequency control circuit means further comprises coincidence detection circuit means for detecting coincidence between the logic level of said regulation sign bit signal and said frequency control signal, and for producing coincidence detection signal indicative of said coincidence, said regulation processing control signal being responsive to said coincidence detection signal for being selectively set to a first logic level, whereby the frequency of oscillation of said low frequency oscillator circuit causes an increase in said timekeeping rate, and a second logic level whereby the frequency of oscillation of said low frequency oscillator circuit causes a retardation of said timekeeping rate, said timekeeping rate advancement or retardation being thereby determined in accordance with the logic level of said regulation sign bit signal.

4. A timekeeping signal source according to claim 1 in which said phase comparison means comprise a data-type flip-flop which receives the output signal from said high frequency oscillator circuit means as a data input signal and said primary frequency division signal as a clock input signal.

5. A timekeeping signal source according to claim 4, in which said phase comparison circuit means further comprises phase comparison stabilization circuit means for generating said phase signal when coincidence between the phase of said high frequency signal and primary frequency division signal applied to said data-type flip-flop is detected as having occurred during a plurality of successive periods of said primary frequency division signal.

6. A timekeeping signal source according to claim 5, in which said phase comparison stabilization circuit means comprises a plurality of data-type flip-flops connected in cascade and driven by an identical signal applied to the clock input terminals thereof.

7. A timekeeping signal source according to claim 1 and further comprising oscillation interval control circuit means coupled to said high frequency oscillator circuit means for controlling said high frequency oscillator circuit means to operate in a periodically intermittent manner, and moreover comprising frequency control information memory means for memorizing frequency control information indicating the status of said frequency control signal during an interval in which said high frequency oscillator circuit means is in operation and phase comparison between said high frequency oscillator circuit output signal and said low frequency oscillator circuit output signal is being performed, and moreover comprising circuit means responsive to said memorized frequency control information for generating signals to control the frequency of oscillation of said low frequency oscillator circuit means in accordance with said memorized control information during intervals in which said high frequency oscillator circuit means are inoperative.

8. A timekeeping signal source according to claim 7, in which said frequency control memory means comprises a first counter circuit.

9. A timekeeping signal source according to claim 8, in which said frequency control signal alternately goes to a first logic level during a first time interval and to a second logic level during a second time interval while said phase comparison operation is in progress, with the relative durations of said first and second time intervals being determined in accordance with said phase signal, and in which said intermittent operation control circuit further comprises:
sources of first and second clock pulse trains;
second counter circuit means coupled to count said first clock pulses;
gate circuit means responsive to said phase comparison signal for transferring said second clock pulses to be counted by said first counter circuit during successive ones of said first time intervals when said frequency control signal is at the first logic level, while said phase comparison operation is in progress;
circuit means for repetitively transferring a count value held in said first counter circuit into said second counter circuit at periodic time intervals, while said high frequency oscillator circuit is inoperative and said phase comparison operation is halted; and
transfer switching circuit means responsive to said phase comparison signal for transferring said frequency control signal to control said frequency changeover means of said low frequency oscillator circuit during intervals when said phase comparison operation is in progress and for transferring an expanded frequency control signal produced by said second counter circuit means during intervals when said high frequency oscillator circuit is inoperative and said phase comparison operation is halted;
said expanded frequency control signal alternately going to said first logic level during a first time interval and to said second logic level during a second time interval within each of said periodic time intervals occurring between successive transfers of the contents of said first counter circuit means to said second counter circuit means, and with the ratio of said first time interval to said second time interval during said inoperative condition of said high frequency oscillator circuit being identical to the ratio of said first time interval to said second time interval of said frequency control signal while said phase comparison operation in progress.

10. A timekeeping signal source according to claim 9, in which said frequency control signal transferred to said frequency changeover means of the low frequency oscillator circuit while said phase comparison operation is in progress acts to control the frequency of oscillation of said low frequency oscillator circuit such that successive transitions of said primary frequency division signal from a first logic level to a second logic level coincide in time with a periodically repeated region of said output signal from said high frequency oscillator circuit, and wherein said phase comparison circuit means further comprises phase lock region changeover circuit means for discriminating between a first logic level and a second logic level state of said high frequency oscillator output signal at the start of an interval of phase comparison operation controlled by said phase comparison signal, and for thereafter during said phase comparison operation interval selectively designating that said successive transition of said primary frequency division signal will occur within a periodically repeated region of said high frequency oscillator output signal at the first logic level and a region of said high frequency oscillator signal at the second logic level, on the basis of said logic level discrimination performed at the start of said phase comparison operation interval.

11. A timekeeping signal source for an electronic timepiece, comprising:

low frequency oscillator circuit means including frequency changeover means for switching the frequency of oscillation thereof at least between a higher and a lower frequency;

high frequency oscillator circuit means having a frequency of oscillation which is an integral multiple of a frequency intermediate between said higher and lower frequencies of oscillation of said low frequency oscillator circuit means;

primary frequency divider circuit means for frequency dividing an output signal produced by said low frequency oscillator circuit means, to thereby produce a primary frequency division signal;

secondary frequency divider circuit means for frequency dividing said primary frequency division signal, to thereby produce a timekeeping signal;

phase comparison means for comparing the phase of said primary frequency division signal with the phase of an output signal from said high frequency oscillator circuit means, to produce a phase signal comprising a train of pulses;

timekeeping rate setting means for producing timekeeping rate setting information to designate an amount of adjustment of the timekeeping rate of said electronic timepiece; and frequency control circuit means coupled to receive said phase signal and said timekeeping rate setting information, comprising bistable circuit means coupled to receive said phase signal for thereby producing a frequency control signal, to control said frequency changeover means and for periodically counting a number of pulses of said phase signal designated by said timekeeping rate setting information and for holding said frequency control signal at a fixed potential during a time interval while said counting is taking place, to thereby fix the frequency of oscillation of said low frequency oscillator circuit means output signal at one of said higher and lower frequencies thereof during said time interval.

* * * * *